United States Patent [19]

Yoshimura et al.

[11] Patent Number: 5,835,544
[45] Date of Patent: Nov. 10, 1998

[54] CLOCK SIGNAL REPRODUCTION CIRCUIT AND DATA REPRODUCTION CIRCUIT

[75] Inventors: Shunji Yoshimura; Junpei Kura, both of Tokyo, Japan

[73] Assignee: Sony Corporation, Tokyo, Japan

[21] Appl. No.: 362,808

[22] Filed: Dec. 22, 1994

[30] Foreign Application Priority Data

Dec. 24, 1993 [JP] Japan .................................. 5-328639
Sep. 26, 1994 [JP] Japan .................................. 6-229833

[51] Int. Cl.$^6$ ..................................................... H03D 3/246
[52] U.S. Cl. ............................ 375/376; 331/1 A; 331/14; 331/17
[58] Field of Search ..................................... 375/371, 373, 375/375, 376; 331/1 R, 1 A, 4, 16, 17, 18, 25, 10; 327/150, 159

[56] References Cited

U.S. PATENT DOCUMENTS

| | | | |
|---|---|---|---|
| 4,330,863 | 5/1982 | Wright | 375/81 |
| 4,339,731 | 7/1982 | Adams | 331/1 A |
| 4,672,447 | 6/1987 | Möring et al. | 375/376 |
| 4,929,918 | 5/1990 | Chung et al. | 331/10 |
| 5,057,794 | 10/1991 | Shih | 331/1 A |
| 5,425,060 | 6/1995 | Roberts et al. | 375/371 |

Primary Examiner—Stephen Chin
Assistant Examiner—Huong Luu
Attorney, Agent, or Firm—Limbach & Limbach L.L.P.

[57] ABSTRACT

A clock signal reproduction circuit including an A/D conversion circuit for converting an input RF analog signal with a restricted upper limit of a frequency band into a digital signal, a digital phase error calculation unit for digitally calculating a phase error of a digital signal converted in the A/D conversion circuit, a control voltage generating unit including a loop filter, a D/A conversion unit for outputting an analog control voltage signal based on the digital phase error calculated, and an analog voltage-controlled type oscillating circuit for outputting a reproduction clock signal having a frequency of at least 2 times the frequency of the input analog signal. The A/D conversion circuit uses the clock signal output from the analog voltage-controlled type oscillating circuit to convert the input analog signal into a digital format and output a reproduction clock signal from the analog voltage-controlled oscillating circuit.

4 Claims, 16 Drawing Sheets

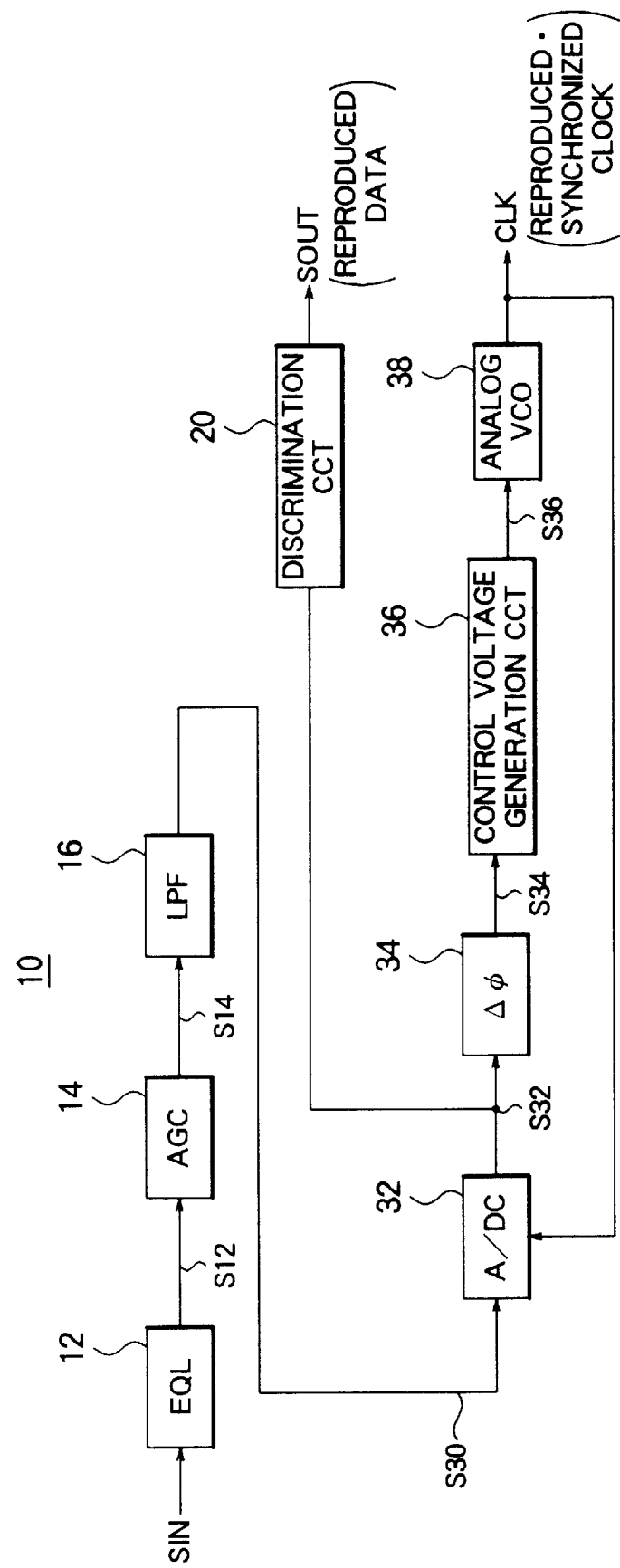

36'

36"

366

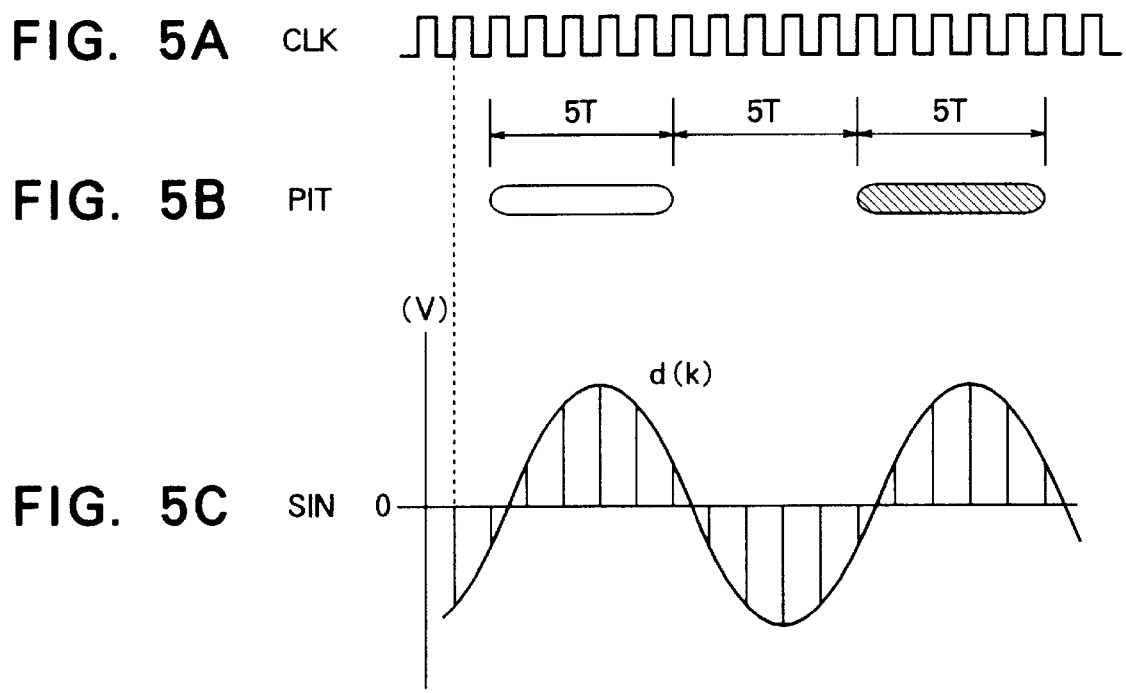

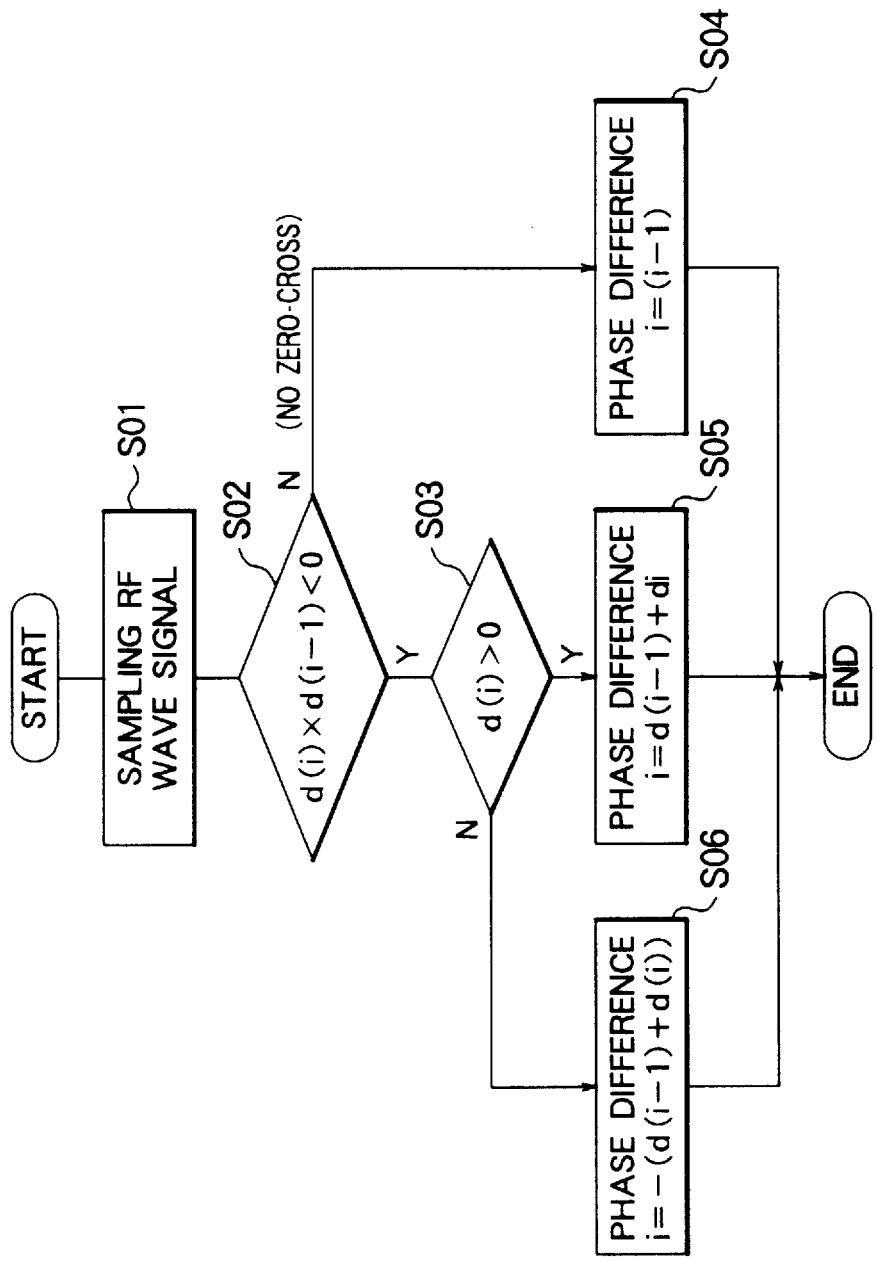

CLOCK SIGNAL REPRODUCTION CIRCUIT AND DATA REPRODUCTION CIRCUIT

BACKGROUND OF THE INVENTION

1. Field of Utilization in Industry

The present invention relates to a synchronization clock signal reproduction circuit for reading out data recorded on an optical disc recording medium such as a read-only-memory (ROM) type optical disc recording medium or magneto-optical (MO) disc recording medium to reproduce a clock signal synchronized with the read signal. It also relates to an optical disc apparatus which uses the synchronization clock signal reproduction circuit to reproduce data recorded on the optical disc recording medium.

2. Description of the Related Art

To accurately reproduce a signal recorded on a recording medium in an optical disc apparatus, video tape recorder, etc., a synchronization clock signal has become necessary.

As a circuit for reproducing a synchronization clock signal, there is for example a clock signal reproduction circuit used for an optical disc recording apparatus, more specifically, a ROM type optical disc recording apparatus. In this case, the clock signal reproduction circuit reproduces a channel clock signal used for restoration of reproduction data from the radio frequency (RF) or high frequency reproduction signal obtained by reading the data recorded on the optical disc recording medium, the data being recorded on the optical disc recording medium through modulation by a channel coding such as eight fourteen modulation (EFM). In such a clock signal reproduction circuit, use has in the past been made of an analog type phase locked loop (PLL) circuit.

FIG. 1 is a circuit diagram of a clock signal reproduction circuit 8 using an analog type phase locked loop circuit.

The clock signal reproduction circuit 8 performs pre-processing on the reproduction signal read from the optical disc apparatus 100 in the pre-processing circuit 10 and produces the reproduction clock signal using the analog type PLL circuit 800.

The optical disc apparatus 100 has an optical disc recording medium 108, an optical system 102 including an optical pickup, an optical disc control unit 104, and a motor 106.

The pre-processing circuit 10 has a waveform equalization circuit (equalization: EQL) 12, an automatic gain control circuit (AGC) 14, and a low pass filter (LPF) 16.

A binary circuit 80 and an edge-detection circuit 82 are provided after the pre-processing circuit 10.

The analog type PLL circuit 800 has an analog phase comparison circuit (PD) 84, an analog loop filter (low pass filter: LPF) 86, and an analog voltage-controlled type oscillating circuit (VCO) 88. The phase comparison circuit 84 compares the output signal of the edge-detection circuit 82 with the output signal of the VCO 88 and outputs a signal corresponding to the phase difference. The loop filter 86 outputs the low frequency component serving as the control voltage of the VCO 88, included in the phase difference signal. The VCO 88 oscillates at a frequency corresponding to the output voltage of the loop filter 86.

The reproduction optical signal read from the optical disc recording medium 108 using the optical system 102, including the optical pickup, is supplied to the waveform equalization circuit (EQL) 12 and processed for waveform equalization. The signal is controlled in gain in the automatic gain control (AGC) 14. Just the signal component less than a predetermined frequency is extracted in the low pass filter (LPF) 16 and supplied to the binary circuit 80.

The binary circuit 80 compares the output reproduction signal of the LPF 16 with a predetermined threshold voltage, converts the reproduction signal to a binary format, and produces a binary reproduction signal. In this example, the binary circuit 80 outputs the logical value 1 when the voltage of the reproduction signal is higher than the threshold voltage and output the logical value 0 when it is lower.

The edge-detection circuit 82 detects the edge of a binary reproduction signal produced in the binary circuit 80, for example, the rising edge, and produces a rising edge signal.

The phase comparison circuit 84 of the analog type PLL circuit 800 compares the phases of the rising edge signal and/or the trailing edge signal detected by the edge-detection circuit 82 and the channel clock signal output from the VCO 88 and outputs the result as the phase difference signal to the loop filter 86. The LPF 86 is a low pass filter, using for example an operational amplifier circuit, which passes a low frequency signal of the phase difference signal from the phase comparison circuit 84 and supplies it as the control voltage signal to the VCO 88. The VCO 88 produces a channel clock signal with a frequency corresponding to the control voltage value supplied from the loop filter 86.

Due to the above operation, the clock signal reproduction circuit 8 produces a synchronization reproduction channel clock signal synchronized with the rising edge and/or trailing edge of the reproduction signal. More specifically, a synchronization reproduction channel clock signal is generated by the voltage-controlled type oscillating circuit (VCO) 88.

This reproduction channel clock signal is used for a data processing operation in circuits provided after the clock signal reproduction circuit 8.

The phase error signal between the reproduction channel clock signal from the VCO 88 detected by the analog phase comparison circuit 84, and the binary reproduction signal, from the edge-detection circuit 82, is produced as an analog signal having a pulse corresponding to the phase difference between the reproduction channel clock signal and the rising edge and/or trailing edge of the binary reproduction signal.

To produce a control voltage signal for controlling the oscillation frequency of the voltage-controlled type oscillating circuit (VCO) 88 from the phase difference signal, it is necessary to perform processing in the loop filter 86 on the phase difference signal by the analog signal processing circuit using, for example, an operational amplifier circuit. If an analog signal processing circuit is used, however, it suffers from the disadvantages that offset adjustments or counter measures against drift accompanying changes in the ambient temperature become necessary.

Various methods have been proposed for overcoming the above disadvantages, but these involve use of special components which then give rise to the disadvantage of higher costs.

Further, in particular, the disadvantages arising from the above analog signal processing circuit become marked in an optical disc apparatus such as a ROM type optical disc apparatus and a MO disc apparatus, for example, where it becomes necessary to perform high precision phase control on the channel clock signal which is used for channel coding when the data is recorded. The reason is that the processes of adjustment of analog signal processing circuits, etc. are extremely troublesome, and high precision, high priced special components are required for the analog signal processing circuit.

As a method for overcoming the above disadvantages, proposal has also been made of a full digital phase locked loop (PLL) circuit suited for large scale integration (LSI) without the problems of drift and offset (See for example, Morio Onoue, et. al, "Optical Disc Technology", Radio Technology Co., pp. 206 to 211.). The full digital PLL circuit described in this reference has a digital phase comparison circuit, a digital loop filter, a digital voltage-controlled type oscillating circuit (VCO), and a digital divider. In the digital phase comparison circuit, for example, use is made of an exclusive OR circuit or edge control type flipflop. However, a phase comparison circuit using an exclusive OR circuit suffers from the disadvantage that error occurs when the duty ratio of the input signal is not 50 percent. A phase comparison circuit using an edge control type flipflop outputs "0" at the rising edge of the input signal and outputs "1" at the trailing edge of the feedback signal from the digital divider. A phase comparison circuit using an edge control type flipflop has the advantage that it does not depend on the duty ratio. A digital loop filter is realized by an up/down counter having a carry output and a borrow output. A digital VCO is realized by a universal counter which receives the carry output of the up/down counter, constituting the digital loop filter, as increment input and receives the borrow output as the decrement input. The digital divider is realized by a digital counter.

The full digital phase locked loop (PLL) circuit, however, suffers from the disadvantages that it becomes necessary to operate the counter with the signal having an operation frequency higher than the channel clock frequency of the signal output from the full digital PLL circuit by several times to several tens of times, and the full digital PLL circuit produces a channel clock signal having a frequency much lower than the operation frequency used in the full digital PLL circuit.

SUMMARY OF THE INVENTION

An object of the present invention is to provide a clock signal reproduction circuit that can operate with stability without the need for offset adjustment without being affected by the drift occurring due to temperature, etc.

Another object of the present invention is to provide a clock signal reproduction circuit that does not require the special components required when performing high precision reproduction clock phase control by an analog signal processing circuit, or which is not subject to the above frequency limitations in the full digital PLL circuit and can be constructed at a low cost.

According to a first aspect of the present invention, a clock signal reproduction circuit is provided, where an upper limit of a frequency band of an analog input RF signal, which is encoded by a channel coding, is equal to or less than ½ of a channel clock frequency of a digital data to be reproduced. The clock signal reproduction circuit reproduces a clock signal from the input RF signal. The clock signal reproduction circuit includes:

an analog/digital conversion circuit for converting the input RF signal into a digital signal, digital phase error calculation means for digitally calculating a phase error of a digital signal converted in the analog/digital conversion circuit, control voltage generating means including a loop filter and digital/analog conversion means for outputting an analog control voltage signal based on the digital phase error calculated, an analog voltage-controlled type oscillating circuit for outputting a reproduction clock signal having a frequency equal to the channel clock frequency of the digital data to be reproduced, and the analog/digital conversion circuit using the reproduced clock signal output from the analog voltage-controlled type oscillating circuit to convert the input signal into a digital format and output the reproduced clock signal from the analog voltage-controlled type oscillating circuit.

A second aspect of the clock signal reproduction circuit according to the present invention provides for an upper limit to a frequency band of an analog input RF signal which is encoded by a channel coding which is equal to or less than $1/(2n)$ of a channel clock frequency of the digital data to be reproduced, where n is an integer equal to or greater than 2. Interpolation means are provided, wherein interpolation of the signal is performed by the interpolation means to reduce the sampling frequency.

That is, the clock signal reproduction circuit of the second aspect of the invention includes:

an analog/digital conversion circuit for converting from an input RF analog signal with a frequency domain having a restricted upper limit into a digital signal, digital signal interpolation means which use a digitally converted signal of the previous sampling point and a digitally converted signal of the present sampling point in the analog/digital conversion circuit to interpolate a digital signal corresponding to a sampling point between the last sampling point and the present sampling point, to make the sampling period $1/m$, where m is an integer equal to or greater than 2, and equal to or less than n, digital phase error calculation means for calculating the phase error of an interpolated digital signal from the interpolation means or a direct sampling of a digital signal, control voltage generating means including a loop filter and digital/analog conversion means for outputting an analog control voltage signal based on the digital phase error calculated, an analog voltage-controlled type oscillating circuit for outputting a reproduction clock signal having a frequency of $1/m$ of the channel clock frequency of the digital data to be reproduced, the analog/digital conversion circuit using the reproduction clock signal for digitally converting the input analog signal into a digital format, and an output of the reproduced clock signal from the analog voltage-controlled type oscillating circuit.

In the clock signal reproduction circuit of the first and second aspects of the invention, provision is preferably made of a smoothing filter circuit for smoothing the digitally converted results in the analog/digital conversion means of the control voltage generating means or at a stage after the analog/digital conversion means.

In the clock signal reproduction circuit of the first and second aspects of the invention, the control voltage generating means may comprise various configurations.

(1) First Circuit Configuration

The control voltage generating means comprises:
a first circuit having
 a digital integration means for integrating the digital phase error signal from the phase error calculation means,
 a first digital/analog conversion circuit for converting the digital integration result into an analog signal, and a first coefficient multiplication circuit for multiplying a converted result of the first digital/analog conversion circuit with a first coefficient;

a second circuit having
a second digital/analog conversion circuit for converting a digital phase error signal from the phase error calculation means into an analog signal and
a second coefficient multiplication circuit for multiplying a converted result of the second digital/analog conversion circuit with a second coefficient; and an addition circuit for adding the output of the first circuit and the output of the second circuit and supplying the result to the analog voltage-controlled type oscillating circuit.

(2) Second Circuit Configuration

The control voltage generating means comprises:

a digital/analog conversion circuit for converting a digital phase error signal from the phase error calculation means into an analog signal; and an analog loop filter circuit for filtering the converted results of the digital/analog conversion circuit.

(3) Third Circuit Configuration

The control voltage generating means comprises:

a digital loop filter means for filtering a digital phase error signal from the phase error calculation means; and a digital/analog conversion circuit for converting the filtering result into an analog signal.

(4) Fourth Circuit Configuration

The control voltage generating means comprises:

a frequency control circuit having a discontinuity point detection circuit for detecting a point of discontinuity by receiving, as input, a phase error signal from the phase error calculation means, an up/down counter for increasing the count value where the point of discontinuity detected is at the up side and decreasing the count value where it is at the down side, and a hold circuit for holding a counting result from the up/down counter;

a phase synchronization/asynchronization detection circuit for detecting if the phase is synchronized based on the counting result from the up/down counter in the frequency control circuit, making the loop filter in the control voltage generating means and the integration means or one of the same inoperative in the state when the phase is not synchronized, clearing the count value of the up/down counter and resetting the held result of the holding circuit when shifting to a state away from the phase synchronization state, and holding the counting result from the up/down counter in the holding circuit when shifting from a state away from the phase synchronization to a state of phase synchronization;

a third digital/analog conversion circuit for converting an output result of the hold circuit in the frequency control circuit into an analog signal; and a second addition circuit for adding the result of the third digital/analog conversion circuit to the output of the control voltage generation circuit, and supplying the result to the voltage-controlled type oscillating circuit.

(5) Fifth Circuit Configuration

The control voltage generating means comprises:
a frequency control circuit having an up/down counter for detecting a point of discontinuity by receiving as input a phase error signal from the phase error calculation means, increasing the count value in the case where the point of discontinuity detected is at the up side, and decreasing the count value where it is at the down side, and a hold circuit for holding a counting result from the up/down counter;

a phase synchronization/asynchronization detection circuit for detecting if the phase is synchronized based on the counting result from the up/down counter in the frequency control circuit, making the loop filter in the control voltage generating means and the integration means or one of the same inoperative in the state when the phase is not synchronized, clearing the count value of the up/down counter and resetting the held result of the holding circuit when shifting to a state away from the phase synchronization state, and holding the counting result from the up/down counter in the holding circuit when shifting from a state away from the phase synchronization to a state of phase synchronization;

a third digital/analog conversion circuit for converting an output result of the hold circuit in the frequency control circuit into an analog signal; and a second addition circuit for adding the result of the third digital/analog conversion circuit to the output of the control voltage generation circuit and supplying the result to the voltage-controlled type oscillating circuit.

(6) Sixth Circuit Configuration

The control voltage generating means comprises:

a discontinuity point detection circuit for detecting a point of discontinuity by receiving as input a phase error signal from the phase error calculation means;

a first switch circuit for selectively switching and outputting a positive predetermined value, a negative predetermined value, and a value of zero according to the discontinuity point detection processing;

a second switch circuit for selecting and outputting a phase error signal from the phase error calculation means and the selected output of the first switch circuit;

a phase synchronization/asynchronization detection circuit for detecting if the phase is synchronized based on the point of discontinuity detected by the discontinuity point detection circuit, which causes the selected output of the first switch circuit to be output from the second switch circuit when the phase is not synchronized, and which causes the phase error signal to be output from the second switch circuit when the phase is synchronized;

a digital integrating means for integrating the output of the second switch circuit;

a first coefficient multiplication means for multiplying a first coefficient with the digitally integrated result;

a second coefficient multiplication means for multiplying a second coefficient with the phase error signal from the phase error calculation means;

an addition means for adding the output of the first coefficient multiplication means and the output of the second coefficient multiplication means; and a digital/analog conversion means for converting the result of addition in the addition means to an analog signal and supplying the result to the voltage-controlled type oscillating means.

According to a third aspect of the invention, a clock signal reproduction circuit is provided, which includes:

a phase locked loop (PLL) circuit having a phase comparing means for detecting a phase difference between a channel coded input signal and a reproduction clock signal having a frequency substantially equal to the frequency of a channel clock signal used for the channel encoding, which is then expressed as a periodic function within a certain range;

a phase difference upper limit detection means for detecting when the real phase difference has changed exceeding the upper limit of the above-mentioned range;

a phase difference lower limit detection means for detecting when the real phase difference has changed exceeding the lower limit of the above-mentioned range; and a synchronization pull-in control means for changing the output frequency of the voltage-controlled type oscillating circuit generating a reproduction clock signal in the phase locked loop (PLL) circuit according to a detection result of the phase difference upper limit detection means and the phase difference lower limit detection means.

Preferably, when the phase comparison characteristic of the phase comparison means becomes discontinuous at the portion exceeding the upper limit of the range and the portion exceeding the lower limit of the range, the phase difference upper limit detection means and the phase difference lower limit detection means detect the point of discontinuity from a detection result of the phase comparison means.

Even more preference is given when provision is made of a phase synchronization/asynchronization detection means for detecting i.e. phase synchronization and phase asynchronization using a detection result of the phase difference upper limit detection means and the phase difference lower limit detection means.

A fourth aspect of the present invention provides a clock signal reproduction and data reproduction circuit including:

signal reading means for reading a signal containing a clock component and recording data read from an optical disc recording medium on which data is recorded by a channel encoding;

the clock signal reproduction circuit;

data discrimination means;

the signal read by the signal reading means being supplied to the clock signal reproduction circuit; and the data discrimination means discriminating the digital signal output from an analog/digital conversion circuit in the clock signal reproduction circuit and reproducing a signal recorded by the optical disc recording medium.

Preferably, the signal reading means contains a waveform equalization circuit for equalizing the waveform, of the read signal;

an automatic gain control circuit for controlling the gain of the waveform equalized signal; and a low pass filter for passing a predetermined frequency component through the gain controlled signal.

The clock signal reproduction circuit of the first aspect of the invention is basically comprised of a phase locked loop circuit (PLL circuit)

comprised of digital phase error calculation means, control voltage generating means, and an analog voltage-controlled type oscillating circuit. An analog/digital conversion circuit is incorporated in this PLL circuit and uses the reproduction clock signal output from the analog voltage-controlled type oscillating circuit as a sampling signal.

The portions requiring adjustment for temperature drift and offset are constructed by digital circuits. Analog circuits constitute the other circuits. No special electronic circuits are needed for these circuits.

The clock signal reproduction circuit of the second aspect of the invention interpolates the output of the analog/digital conversion circuit using the interpolation means and reduces the sampling frequency by that amount.

The clock signal reproduction circuit of the third aspect of the invention uses the synchronization pull-in control circuit to quickly perform the frequency pull-in operation and phase pull-in operation.

Of course, the clock signal reproduction circuit of the third aspect of the invention may be applied to clock the reproduction circuit of the first and the second aspects of the invention.

The clock signal reproduction and data reproduction circuit of the fourth-aspect of the invention use the clock signal reproduction circuit of the present invention for reproduction of the clock signal and for reproduction of data.

BRIEF DESCRIPTION OF THE DRAWINGS

These and other objects and features of the present invention will become clearer from the following description of the preferred embodiments with reference to the accompanying drawings.

FIG. 2 is a circuit diagram of the first embodiment of the clock signal reproduction circuit of the present invention.

FIG. 5A is a waveform diagram of a reproduction synchronization clock signal produced by an analog voltage-controlled type oscillating circuit (VCO) of a hybrid phase locked loop (PLL) circuit shown in FIG. 2.

FIG. 5B is a graph showing the position of bits in an optical disc recording medium on which data is recorded by a blocking (4, 22; 2, 5; 5) run length limited (RLL) encoding system.

FIG. 5C is a graph showing sampling points (sampling timings) of a reproduction synchronization clock signal from an analog VCO circuit and a reproduction RF signal SIN.

FIGS. 6A to 6C are graphs showing the enlarged waveforms near the rising edge of the reproduction RF signal and the sampling points of the same while FIGS. 6D to 6F are graphs showing the enlarged waveforms near the trailing edge of the reproduction RF signal and the sampling points of the same.

FIG. 7 is a flow chart showing the phase error detection processing of the phase error calculation means shown in FIG. 2.

DESCRIPTION OF THE PREFERRED EMBODIMENTS

Figure 1:
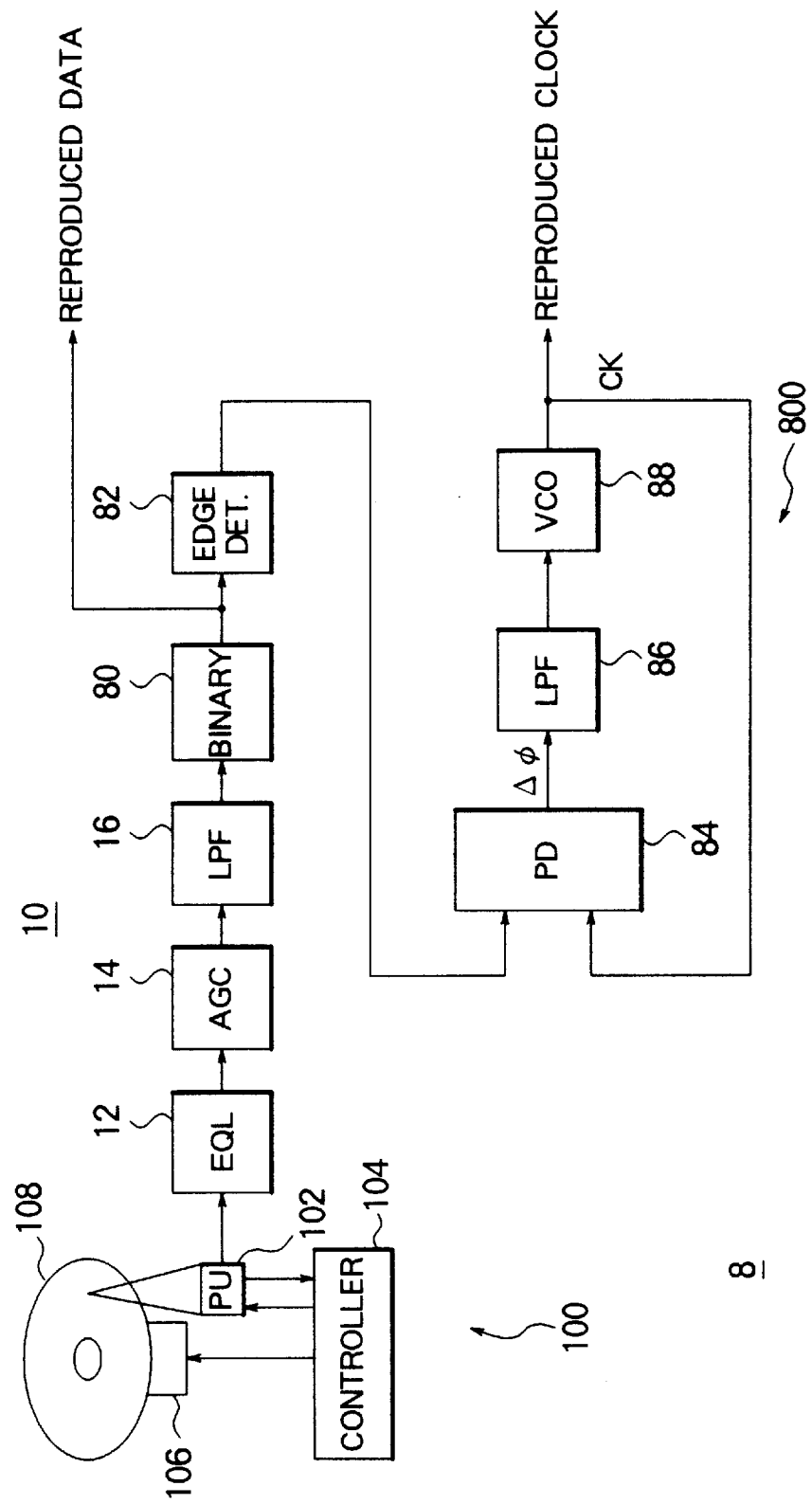
FIG. 1 is a view of the circuit configuration of a conventional clock signal reproduction circuit using an analog type phase locked loop circuit.

Preferred embodiments of the present invention will now be described.

Here, a description will be given of a clock signal reproduction circuit applied to a ROM type optical disc apparatus or a magneto-optic disc apparatus as a clock signal-reproduction circuit of this invention (hereinafter also referred to as an optical disc apparatus).

Before describing the clock signal reproduction circuit of the present invention, an explanation will be made of the encoding system (channel encoding) of the data recorded on the optical disc recording medium with respect to the clock signal reproduction in the clock signal reproduction circuit, the cutoff frequency of the signal component of the reproduction signal, the relationship between the cutoff frequency and the frequency of the clock signal, and the relationship between the sampling frequency of the reproduction signal and the frequency of the clock signal.

The digital data recorded on an optical disc recording medium includes, for example motion picture data, still picture data, and voice data or any combinations of the same. This digital data is encoded by the blocking (4, 22; 2, 5;5) run length limited (RLL) encoding system with run lengths limited to a range of 4 to 22 for example and then stored on the optical disc recording medium.

Here, an explanation will be made about the blocking (4, 22; 2,5;5) RLL encoding system.

This encoding system is generally called the blocking (d, k;m, n;r) RLL encoding system. It is a kind of encoding system that converts data words obtained by blocking digital data of (m×i) bits to a recording code of (n×i) channel bits by channel encoding. The symbol d shows the minimum consecutive number of the same symbol (for example, 0), k shows the maximum consecutive number of the symbol 0, and r shows the restriction length.

In a blocking (d, k; m, n; r) RLL encoding system, when i=1, the result is a fixed length code, while when i>1 and the restriction length r>1, the result is a variable length code.

In a blocking (4, 22;2, 5; 5) RLL encoding system, the blocked data having a basic data length of m=2 bits is converted into code words having a basic code length of n=5 bits. With such code words, use is made of the six basic types of codes shown in the following Table 1. The digital data may then be converted to variable length code words by the combinations of these six types of codes.

TABLE 1

| | |
|---|---|
| (1) | 10000 |
| (2) | 01000 |
| (3) | 00100 |
| (4) | 00010 |
| (5) | 00001 |
| (6) | 00000 |

Table 2 shows the number of effective codes obtained using these basic codes:

TABLE 2

| (Basic-code) | (r) | (N) | (M) | (D) |
|---|---|---|---|---|
| 2,5 | 1 | 4 | 2 | 2 |
| 2,5 | 2 | 8 | 4 | 4 |
| 2,5 | 3 | 1 | 9 | 7 |
| 2,5 | 4 | 2 | 20 | 8 |
| 2,5 | 5 | 32 | 34 | −2 |

Here, r is the restriction length, N is the number of code words necessary, M is the number of code words which actually may be used, and D=N−M.

As is clear from Table 2, along with the increase of r as 1,2,3,4 and 5, the number N of necessary code words correspondingly increases as 4, 8, 16, 28 and 32 and the number M of code words which can actually be used increases from 2, to 4, to 9, to 20, to 34.

Accordingly, it is possible to convert original digital data into code words without excess or shortage by using the code words of restriction lengths r up to 5.

Tables 3-1 to 3-5 show specific examples of tables for converting digital data into code words using the basic codes shown in Table 1:

TABLE 3-1

| (1) r = 1 | |
|---|---|
| (Data) | (code) |
| 11 | 00000 |
| 10 | 10000 |
| 111111 | 00001 00001 00000 |

TABLE 3-2

| (2) r = 2 (Data) | (Code) |
|---|---|
| 0111 | 01000 00000 |
| 0110 | 00100 00000 |
| 0101 | 00010 00000 |
| 0100 | 00001 00000 |

TABLE 3-3

| (3) r = 3 (Data) | (Code) |
|---|---|
| 001111 | 01000 01000 00000 |
| 001110 | 01000 00100 00000 |
| 001101 | 01000 00010 00000 |
| 001100 | 01000 01001 00000 |
| 001011 | 00010 00001 00000 |
| 001010 | 00100 00100 00000 |
| 001001 | 00100 00010 00000 |
| 001000 | 00100 00001 00000 |
| 001111 | 00010 00010 00000 |

TABLE 3-4

| (4) r = 4 (Data) | (Code) |
|---|---|
| 00011011 | 01000 01000 01000 00000 |
| 00011010 | 01000 01000 00100 00000 |
| 00011001 | 01000 01000 00010 00000 |
| 00011000 | 01000 01000 00001 00000 |
| 00010111 | 01000 00010 00001 00000 |
| 00010110 | 01000 00100 00100 00000 |
| 00010101 | 01000 00100 00010 00000 |
| 00010100 | 01000 00100 00001 00000 |
| 00010101 | 01000 00100 00010 00000 |
| 00010100 | 01000 00100 00001 00000 |
| 00010011 | 01000 00010 00001 00000 |
| 00010010 | 01000 00100 00100 00000 |
| 00010001 | 01000 00100 00010 00000 |
| 00010100 | 01000 00100 00001 00000 |
| 00001111 | 01000 00010 00010 00000 |
| 00001110 | 00100 00100 00100 00000 |
| 00001101 | 00100 00100 00010 00000 |
| 00001100 | 00100 00100 00001 00000 |
| 00001011 | 01000 00001 00001 00000 |
| 00001010 | 00001 00001 00001 00000 |
| 00001001 | 00010 00010 00010 00000 |
| 00001000 | 00010 00010 00001 00000 |

TABLE 3-5

| (5) r = 5 (Data) | (Code) |
|---|---|
| 0000011111 | 01000 01000 01000 01000 00000 |
| 0000011110 | 01000 01000 01000 00100 00000 |
| 0000011101 | 01000 01000 01000 00010 00000 |
| 0000011100 | 01000 01000 01000 00001 00000 |
| 0000011011 | 01000 01000 00010 00001 00000 |
| 0000011010 | 01000 01000 00100 00100 00000 |
| 0000011001 | 01000 01000 00100 00010 00000 |
| 0000011000 | 01000 01000 00100 00001 00000 |
| 0000010111 | 01000 01000 00010 00010 00000 |
| 0000010110 | 01000 00100 00100 00100 00000 |
| 0000010101 | 01000 00100 00010 00010 00000 |
| 0000010100 | 01000 00100 00001 00001 00000 |
| 0000010011 | 01000 00010 00001 00001 00000 |
| 0000010010 | 01000 00100 00001 00001 00000 |
| 0000010001 | 01000 00100 00010 00010 00000 |
| 0000010000 | 01000 00100 00010 00001 00000 |

TABLE 3-5-continued

| (5) r = 5 (Data) | (Code) |
|---|---|
| 0000001111 | 01000 01000 00001 00001 00000 |
| 0000001101 | 01000 00010 00010 00010 00000 |
| 0000001100 | 01000 00010 00010 00001 00000 |
| 0000001011 | 00100 00100 00010 00010 00000 |
| 0000001010 | 00100 00100 00100 00100 00000 |
| 0000001001 | 00100 00100 00100 00010 00000 |
| 0000001000 | 00100 00100 00100 00001 00000 |
| 0000000111 | 00100 00100 00010 00010 00000 |
| 0000000101 | 00100 00010 00010 00010 00000 |
| 0000000100 | 00100 00010 00010 00001 00000 |
| 0000000011 | 00100 00001 00001 00001 00000 |
| 0000000010 | 00010 00010 00001 00001 00000 |
| 0000000001 | 00010 00010 00010 00010 00000 |
| 0000000000 | 00010 00010 00010 00001 00000 |

As will be understood from Tables 3-1 to 3-5, the digital data of 2, 4, 6, 8 and 10 bits are converted into code words having lengths of 5, 10, 15, 20 and 25 respectively.

As shown in Table 3-1, when the digital data is (11), the code word becomes (00000). When the digital data (11) continues, a long string of the logical value 0 of the code words occurs and it becomes practically impossible to extract the clock signal (channel clock signal) when reading recorded data from an optical disc recording medium.

Therefore, for example, when the digital data has a logical value 1 for six bits in succession (digital data 111111), the code word is converted to 15-bit data (00001 00001 00000). That is, "1" is inserted and extraction of the clock signal from a large number of successive 0's becoming impossible is prevented.

The minimum inversion interval $T_{min}$ in the blocking (d, k; m, n; r) RLL encoding system is defined by the following equation:

$$T_{min}=(m/n)(k+1)T_{data} \quad (1)$$

where, $T_{data}$ is the time interval of the digital data.

The minimum inversion time $T_{min}$ of the (4, 22; 2, 5;5) RLL encoding system becomes 2.0 $T_{data}$, This is larger than other systems, for example, the 1.41 $T_{data}$ of the EFM system or the 1.78 $T_{data}$ of the system with a minimum number of consecutive identical symbols d=3 (3Z system). In other words, an advantage of the (4, 22; 2, 5; 5) RLL encoding system is that it allows a larger minimum inversion time.

The ranges of the normalized space frequency (NA/λ) in the case of recording on a digital data encoded at the same density by the blocking (4, 22; 2, 5; 5) RLL encoding system, EFM system, and 3Z system on an optical disc recording system are as follows:

TABLE 4

| Encoding system | NA/λ |
|---|---|
| (4, 22; 2, 5; 5) RLL encoding system | 0.24–1.1 |
| EPM system | 0.43–1.57 |
| 3Z system | 0.31–1.24 |

From this comparison, one learns that the blocking (4, 22; 2, 5; 5) RLL encoding system is suited for high density recording.

In actuality, digital data encoded by the blocking (4, 22; 2, 5; 5) RLL encoding system on an optical disc recording medium covered by the clock signal reproduction of a clock signal reproduction circuit of the present invention is recorded by the non-return to zero inverted (NRZI) format, wherein the logical value is inverted when the logical value of the code is "1", and the logical value is not inverted when the logical value of the code is "0".

The clock signal reproduction circuit of the present invention carries out processing assuming that the shortest pit in an optical disc recording medium corresponds to 5 periods (5T) worth of clock signals used in the clock signal reproduction processing. Note that there are also pits corresponding to 6 to 23 periods as well.

The cutoff space frequency $f_s$ having a distribution of signal components of the reproduction signal reproduced from the optical disc recording medium defined by equation 2 depends on the numerical aperture (NA) of the objective lens of the optical system of the optical disc apparatus and the wavelength $\lambda$ of a laser beam used for reproduction.

$$f_s = 2NA/\lambda \qquad (2)$$

Here, if the numerical aperture NA=0.55 and $\lambda$=532 nm, then the cutoff space frequency $f_s$=2067.7/nm.

Further, if the width (dw) of the detection window of the reproduction signal 0.087 $\mu$m and the linear speed (v) of the optical disc recording medium is 5.2 m/s, the frequency of the clock signal (clock frequency=$f_{clock}$=1/T) obtained by equation 3(below) is 60 MHz, and the cutoff frequency $f_c$ obtained by equation 4 (below) is 10.8 MHz.

$$f_{clock} = v/dw \qquad (3)$$

$$f_c = f_s v \qquad (4)$$

Here, the following equation 5 must stand between the clock frequency $f_{clock}$ and the cutoff frequency $f_c$. If equation 5 does not stand, then short marks (pits) can no longer be read.

$$(f_{clock}/5)/2 < f_c \qquad (5)$$

The numerical value 5 in equation 5 originates from the fact that the shortest pit corresponds to 5 periods of clock signals in a clock signal reproduction circuit of the present invention. Note that there are also pits corresponding to 6 to 23 periods.

Further, when sampling a reproduction signal, it is possible to perform the sampling (analog/digital conversion) without loss of information of the reproduction signal when the sampling frequency $f_{samp}$ satisfies the equation 6 by a sampling theorem.

$$f_{samp}/2 > f_c \qquad (6)$$

Accordingly, it is possible to perform accurate sampling of a reproduction signal using a clock signal meeting this condition.

Note that in the clock signal reproduction circuit of the present invention as mentioned later, sampling of the reproduction signal is performed at the rising edge of the clock signal so as to perform sampling in synchronization with the clock signal. Further, the sampling frequency $f_{samp}$ is made equal to the clock frequency $f_{clock}$.

First Embodiment

FIG. 2 is a circuit diagram of a first embodiment of a clock signal reproduction circuit of the present invention. The clock signal reproduction circuit is applied to a ROM type optical disc apparatus to reproduce a clock signal and data.

This clock signal reproduction circuit has a pre-processing circuit 10 and a hybrid phase locked loop circuit 30.

Note that it is possible to add a data discrimination circuit 20 to this clock signal reproduction circuit and carry out reproduction of data in addition to reproduction of a clock signal and thereby constitute a clock signal and a data reproduction circuit.

The pre-processing circuit 10 has a waveform equalization circuit (equalization: EQL) 12, an automatic gain control circuit (AGC) 14, and a low pass filter (LPF) 16.

The hybrid phase locked loop (PLL) circuit 30 has an analog/digital conversion circuit 32, a digital phase error calculation means 34, a VCO control voltage generating circuit 36 containing a loop filter and a digital/analog conversion circuit, and an analog voltage-controlled type oscillating circuit 38. Because the PLL circuit 30 includes both analog circuits and digital circuits in this way, it is called a hybrid PLL circuit in this specification.

The waveform equalization circuit (EQL) 12 performs waveform equalization on the high frequency input reproduction signal SIN read for example from an optical disc recording medium. This input reproduction signal SIN has a clock component.

The data is encoded by channel encoding such as the above mentioned block RLL, EFM, and recorded on the optical disc recording medium, and thus, the clock signal reproduced by the clock signal reproduction circuit is a channel clock signal used for the channel encoding.

Note, the upper limit of the frequency band of the input RF signal read from the optical disc recording medium is limited to a half of a frequency of the channel clock of the digital data to be reproduced.

The AGC circuit 14 performs gain control to a predetermined size on the signal S12 equalized in waveform in the waveform equalization circuit (EQL) 12.

The LPF 16 passes the signal component used for the clock signal reproduction in the signal components S14 adjusted in gain and applies it as the PLL input signal S30 to the hybrid PLL circuit 30.

The analog/digital conversion circuit (ADC) 32 of the hybrid PLL circuit 30 uses the reproduction synchronization clock signal CLK produced at the analog VCO circuit 38 as a sampling signal and samples the PLL input signal S30 output from the LPF 16 and converts it into a digital signal S32.

The digital phase error calculation means 34 digitally calculates a phase error of the digital signal S32. Normally, the PLL circuit calculates a phase difference of two signals, that is, an input signal, for example, here, the phase locked loop (PLL) input signal S30 and an output signal from the analog voltage-controlled type oscillating circuit (VCO) 38 or a frequency divided clock signal obtained by frequency division at a frequency divider circuit of a reproduction clock signal produced at the analog VCO circuit 38. Note should be taken here, however, that the phase error calculation means 34 digitally calculates the phase error from a standard phase of a digital signal S32 sampled at analog/digital conversion circuit (ADC) 32, not the phase difference of two signals. Details will be given later. Accordingly, only the output of the analog/digital conversion circuit (ADC) 32, that is, the digital signal S32, is supplied to the phase error calculation means 34.

The VCO control voltage generating circuit 36 containing the loop filter and the digital/analog conversion circuit (DAC) basically contains the loop filter which outputs a control voltage used for oscillating the analog VCO 38 at a frequency corresponding to a channel clock frequency of the digital data to be reproduced, and a digital/analog conversion circuit (DAC) because the output signal of the phase error calculation means 34 is a digital signal.

The loop filter circuit may be an analog loop filter circuit or may be a digital loop filter circuit.

Figure 3A:
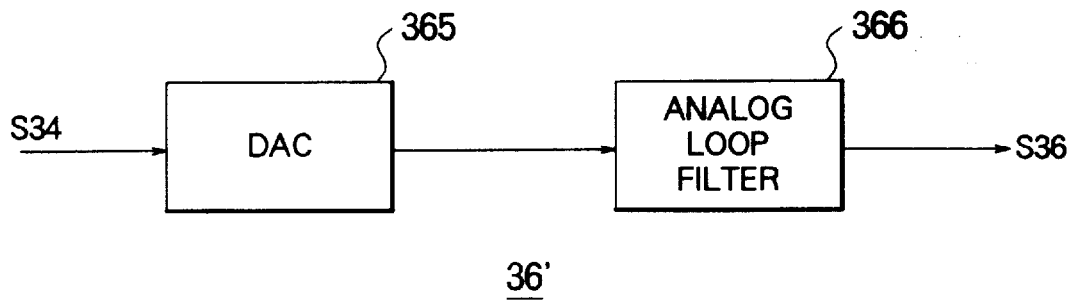
FIGS. 3A and 3B are circuit diagrams of a VCO control voltage generating circuit of a clock signal reproduction circuit applied to an optical disc apparatus.

In the case where an analog loop filer circuit is employed, as shown in FIG. 3A, a VCO control voltage generation circuit 36' includes a DAC 365 and an analog loop filter 366. The DAC 365 converts the digital phase error signal S34 from the phase error calculation means 34 to an analog signal, and the analog loop filter 366 performs the filtering of the same.

Figure 3B:
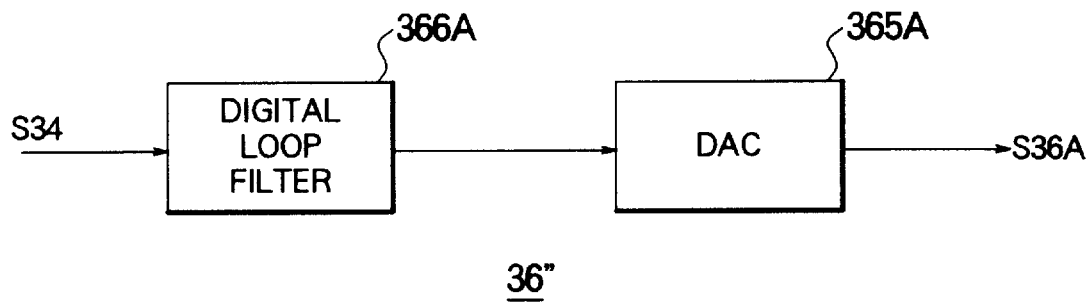
Figure 4:
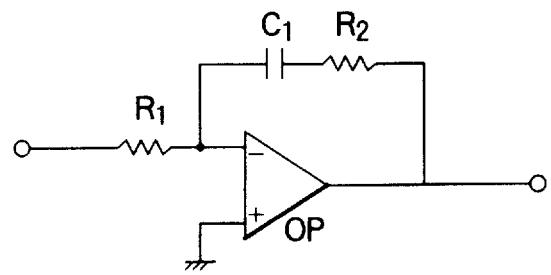
FIG. 4 is a view of the circuit configuration of a loop filter shown in FIG. 3A.

FIG. 4 is a circuit diagram of an analog loop filter. The analog loop filter consists of an operational amplifier OP, a series input resistor R1, a negative feedback resistor R2, and a negative feedback capacitor C1. In the case where a digital loop filter circuit is employed, as shown in FIG. 3B, first, at a digital loop filter 366A, a digital signal corresponding to the VCO control voltage for operating the analog VCO circuit 38 is produced from the phase error signal S34 detected by the digital low pass filter phase error calculation means 34, which is then converted into an analog signal S36 in a digital/analog conversion circuit (DAC) 365A.

The analog signal converted by the DAC 365 shown in FIG. 3A and the DAC 365A shown in FIG. 3B is a discrete value due to a resolution of the DAC 365 or the DAC 365A. Therefore, provision of a smoothing filter built-in to or following the DAC 365 or the DAC 365A, is preferable so as to provide a continuous (smooth) analog VCO control voltage, so that the VCO 38 outputs a continuous frequency signal.

The analog voltage-controlled type oscillating circuit (VCO) 38 oscillates at a frequency corresponding to the value of the analog control voltage signal S36 from the VCO control voltage generating circuit 36 and outputs a reproduction synchronization clock signal CLK.

This reproduction synchronization clock signal CLK is used for other circuits of the optical disc apparatus and is supplied to the analog/digital conversion circuit (ADC) 32 and used as a sampling signal in the analog/digital conversion circuit (ADC) 32.

The hybrid phase locked loop (PLL) circuit 30 basically resembles a normal PLL circuit in operation except for the circuit operation of the phase error calculation means 34, but the ADC circuit 32, phase error calculation means 34, and part of the VCO control voltage generating circuit 36, and other portions susceptible to drift and portions susceptible to offset are constituted by digital circuits so as to prevent them from being affected by the drift and offset. Use is made of an analog voltage-controlled type oscillating circuit (VCO) 38, in other words, use is not made of a high speed operation counter, to produce the reproduction synchronization clock signal CLK. As a result, the hybrid PLL circuit 30 has a high precision and low price in circuit configuration.

To explain the invention more specifically, the input reproduction signal SIN of the reproduction signal read from an optical disc apparatus 100 illustrated in FIG. 1 will be described so as to explain the operation of the hybrid PLL circuit 30 as a clock signal reproduction circuit.

FIG. 5A is a waveform diagram of a reproduction synchronization clock signal CLK produced by the analog VCO circuit 38 of the hybrid PLL circuit 30 shown in FIG. 2. FIG. 5B is a graph showing the position of bits in the optical disc recording medium 108 on which data is recorded by a blocking (4, 22; 2, 5; 5) RLL encoding system. FIG. 5C is a graph showing the sampling points (sampling timings) of a reproduction synchronization clock signal CLK from the analog VCO circuit 38 and the reproduction RF signal SIN.

Figure 6A:
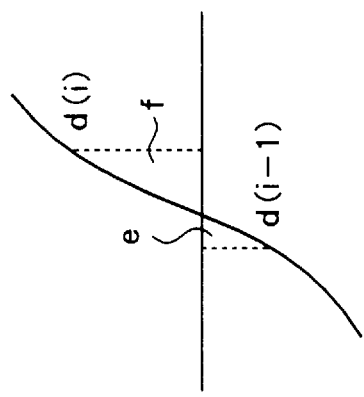
FIGS. 6A to 6F are views showing the enlarged waveforms near the points of change of the reproduction RF signal shown in FIG. 5C and the sampling points of the same. Specifically.
Figure 6B:
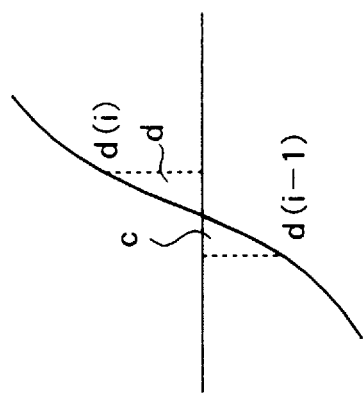
Figure 6C:
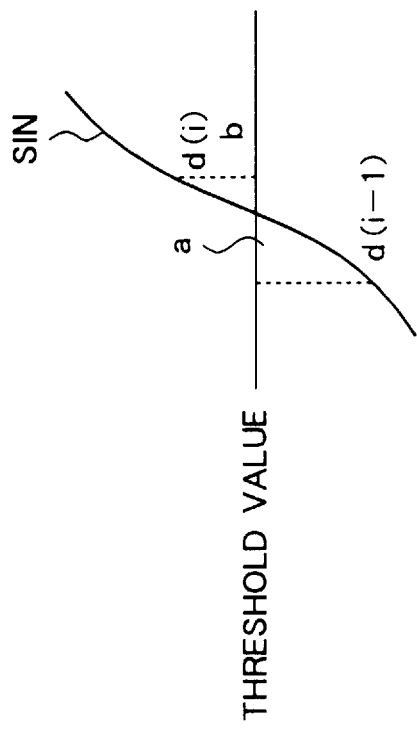
Figure 6D:
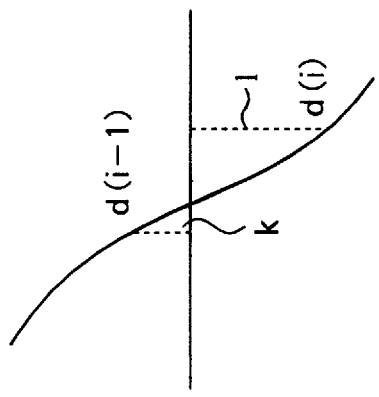
Figure 6E:
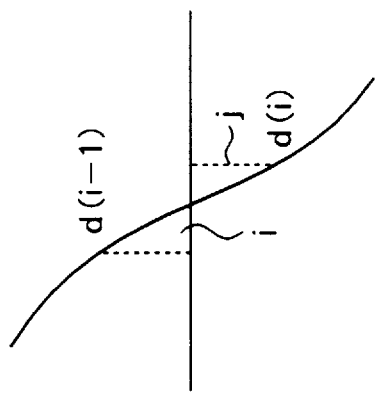
Figure 6F:
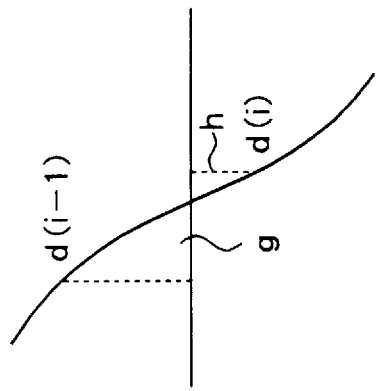

FIGS. 6A to 6F are views showing the enlarged waveforms near the points of change of the reproduction RF signal SIN shown in FIG. 5C and the sampling points of the same. In particular, FIGS. 6A to 6C are graphs showing the enlarged waveforms near the rising edge of the reproduction RF signal SIN and the sampling points of the same, while FIGS. 6D to 6F are graphs showing the enlarged waveforms near the trailing edge of the reproduction RF signal SIN and the sampling points of the same.

FIG. 7 is a flow chart showing the phase error detection processing of the phase error calculation means 34.

An explanation will now be made of the operation of the phase error calculation means 34 referring to FIGS. 5A to 5C, to FIG. 7.

The reproduction signals corresponding to a pit of an optical disc recording medium having data recorded by the blocking (4, 2; 2, 5; 5) RLL encoding system and a boundary with portions other than the pit become the rising edge and trailing edge of the reproduction signal.

Hereinafter, the rising edge and/or the trailing edge will be called "the change" or "the changes".

These changes can be detected when the digital reproduction signal d(k)+ (k showing any sampling point) of a value below the threshold value, where, the threshold value is zero in this case and the digital reproduction signal d(k)− of a value above the threshold value are continuous and, conversely, when the digital reproduction signal d(k)− of a value above the threshold value and the digital reproduction signal d(k)+ of a value below the threshold value are continuous.

Further, since it is considered that the changes of the two reproduction signals adjacent to the changing portions will be substantially constant and linear, it may be considered that the sum of the values of two consecutive digital reproduction signals d(k) sandwiching the threshold value between them will correspond to the phase error between the reproduction synchronization clock signal CLK at the point of change, that is, the sampling signal at the analog/digital conversion circuit (ADC) 32, and the digital reproduction signal d(k). In other words, the phase error calculation means 34 does not compare the phase of the PLL input signal S30 and reproduction synchronization clock signal CLK directly, but performs sampling of the PLL input signal S30 based on the reproduction synchronization clock signal CLK at the ADC circuit 32. The resultant digital signal 32, that is, the digital reproduction signal d(k), includes information of the reproduction synchronization clock signal CLK, so the phase error calculation means 34 detects the phase error under this assumption.

As shown in FIGS. 5A and 5B, the shortest pit in the optical disc recording medium on which data is recorded in by the blocking (4, 22; 2, 5; 5) RLL encoding system corresponds to 5 periods (5T) of clock signals. Note that there are also pits corresponding to 6T to 23T.

The reproduction RF signal SIN read from the optical disc recording medium 108, shown in FIG. 1, becomes a sine waveform of which the upper limit of the frequency band is restricted, as shown in FIG. 5C. The waveform of the reproduction RF signal SIN is sampled at a rising edge of the reproduction synchronization clock signal CLK from the analog voltage-controlled type oscillating circuit (VCO) 38 in the ADC circuit 32 and becomes a digital reproduction signal d(k). Note that the digital reproduction signal d(k) is an actual digital format signal, but for purposes of illustration is shown like an analog format signal.

Referring to FIGS. 6A to 6F, an explanation will be made of the detection operation of phase error in a phase error calculation means 34 taking note of the portion involving the reproduction RF signal SIN and the threshold value. Note that in this embodiment, the threshold value is a voltage=0 and the reproduction RF signal SIN is a voltage signal, too. The digital reproduction signal in the last sampling is represented as d(i−1) and the digital reproduction signal in the current sampling is represented as d(i).

FIGS. 6A to 6B show the enlarged waveforms near the rising edge of the reproduction RF signal SIN, the sampling point by the reproduction synchronization clock signal CLK at the analog/digital conversion circuit (ADC) 32, and the digital reproduction signal d(k).

FIGS. 6D to 6F show the enlarged waveforms near the trailing edge of the reproduction RF signal SIN, the sampling point by the reproduction synchronization clock signal CLK, and the digital reproduction signal d(k). Note that the explanation is made of the case of synchronization between the trailing edge of the reproduction RF signal SIN and the rising edge of the reproduction synchronization clock signal CLK.

(1) Case of no phase error: FIG. 6B

When there is no phase error between the rising edge of the reproduction RF signal SIN and the rising edge of the reproduction synchronization clock signal CLK, the changes of the reproduction RF signal SIN at the points of change are considered to be linear, so the point at which the reproduction RF signal SIN and the threshold value intersect, as shown in FIG. 6B, is at substantially the middle of the sampling points. In this case, |d(i)|=|−d(i−1)|. In other words, the absolute value of d(i) and the absolute value of −d(i−1) are equal or almost equal.

(2) Case where reproduction synchronization clock signal CLK is advanced in phase from rising edge of reproduction RF signal SIN: FIG. 6A When the reproduction synchronization clock signal CLK has a phase error being advanced in phase from the rising edge of the reproduction RF signal SIN, as shown in FIG. 6A, the sampling point becomes positioned after the middle of the sampling points and |−d(i)|<|d(i−1)|.

(3) Case where reproduction synchronization clock signal CLK is retarded in phase from rising edge of reproduction RF signal SIN: FIG. 6C When the reproduction synchronization clock signal CLK has a phase error being retarded in phase from the rising edge of the reproduction RF signal SIN, as shown in FIG. 6C, the sampling point becomes positioned in front of the middle of the sampling points and |−d(i)|>|d(i−1)|.

(4) Case of no phase error: FIG. 6E

When there is no phase error between the reproduction synchronization clock signal CLK and the reproduction RF signal SIN, as shown in FIG. 6E, the point where the reproduction signal and threshold value cross is at substantially the middle of the sampling points and therefore d(i)=−d(i−1).

(5) Case where reproduction synchronization clock signal CLK is advanced in phase from trailing edge of reproduction RF signal SIN: FIG. 6D When the reproduction synchronization clock signal CLK has a phase error being advanced in phase from the trailing edge of the reproduction RF signal SIN, as shown in FIG. 6D, the sampling point becomes positioned before the middle of the sampling points and |d(i)|<|−d(i−1)|.

(6) Case where reproduction synchronization clock signal CLK is retarded in phase from trailing edge of reproduction RF signal SIN: FIG. 6F When the reproduction synchronization clock signal CLK has a phase error being retarded in phase from the trailing edge of the reproduction RF signal SIN, as shown in FIG. 6F, the sampling point becomes positioned after the middle of the sampling points and |d(i)|>|−d(i−1)|.

As explained above, for example, when there is a need for synchronization of only the rising edge of the reproduction RF signal SIN and the trailing edge of the reproduction synchronization clock signal CLK, it is possible to suitably construct a phase error calculation means 34, and thereby have the hybrid PLL circuit 30 produce a reproduction synchronization clock signal CLK in synchronization with the trailing edge of the reproduction RF signal SIN.

Below, an explanation will be made of the operation of phase error detection processing of the phase error calculation means 34 and its related circuits with reference to FIG. 7.

Step 01: The analog/digital conversion circuit (ADC) 32 performs sampling of the reproduction RF signal SIN at a rising edge of the reproduction synchronization clock signal CLK and supplies it to the phase error calculation means 34 as the digital signal d(k).

Step 02: The phase error calculation means 34 multiplies the two consecutive digital reproduction signals d(i−1) and d(i) and determines whether or not the product is negative. When the product is negative, it means that the two consecutive digital reproduction signals are positions on opposite sides of the threshold value (0). When the two consecutive digital reproduction signals are at positions on opposite sides, the routine proceeds to the processing of step 03. When the two consecutive digital reproduction signals are at positions on the same side, the routine proceeds to the processing of step 04. Note that to detect at which positions the two consecutive digital reproduction signals are, it is also possible not to multiply the two digital reproduction signals, but detect if the signs of the two digital reproduction signals are the same or different.

Step 03: The phase error calculation means 34 judges whether the current digital reproduction signal d(i) is positive or not. If the digital reproduction signal d(i) is positive, the digital reproduction signals d(i) and d(i−1) correspond to the rising edge, so the routine proceeds to the processing of step 05, while if it is not positive, the digital reproduction signals d(i) and d(i−1) correspond to the trailing edge, so the routine proceeds to the processing of step 06.

Step 04: The phase error calculation means 34 makes the phase error ΔΦ(i) the previous phase error ΔΦ(i−1)

Step 05: The phase error calculation means 34 calculates the phase error ΔΦ(i)=−(d(i−1)+d(i)).

Step 06: The phase error calculation means 34 calculates the phase error ΔΦ(i)=d(i−1)+d(i).

The phase error calculation means 34 shown in FIG. 2 detects the phase error between the reproduction RF signal SIN and the reproduction synchronization clock signal CLK by the above-mentioned processing operation as the difference between the digital reproduction signals before and after a point of change and outputs the difference as the phase error signal S34.

The VCO control voltage generating circuit 36 produces the analog control voltage signal S36 for operating the analog voltage-controlled type oscillating circuit (VCO) 38 and the analog VCO circuit 38 outputs the reproduction synchronization clock signal CLK. The reproduction synchronization clock signal CLK is synchronized with the reproduction RF signal SIN. Further, the hybrid PLL circuit 30 operates with stability as described above, so the reproduction synchronization clock signal CLK is accurate. In other words, there is little effect due to temperature drift, offset, etc.

If use is made of such a reproduction synchronization clock signal CLK to discriminate a digital reproduction RF signal sampled in a data discrimination circuit 20, it is possible to reproduce accurate data.

Second Embodiment

Figure 8:
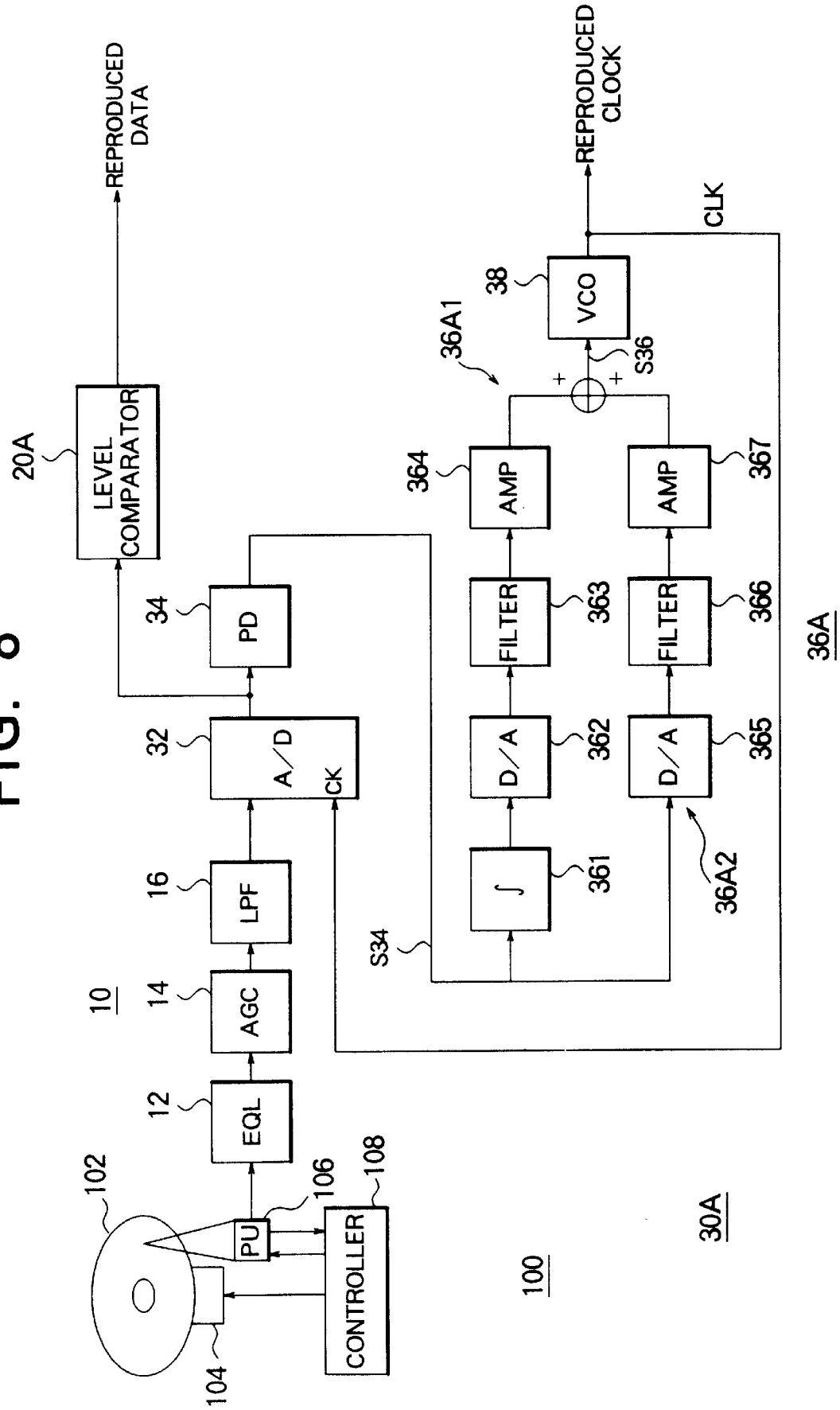
FIG. 8 is a circuit diagram of a clock signal reproduction circuit applied to an optical disc apparatus as in a second embodiment of a clock signal reproduction circuit of the present invention.

A modification of the clock signal reproduction circuit 8 shown in FIG. 2 is shown in FIG. 8 as a second embodiment of a clock signal reproduction circuit of the present invention.

FIG. 8 is a circuit diagram of a clock signal reproduction circuit having a hybrid phase locked loop PLL circuit 30 applied to an optical disc apparatus 100.

The optical disc apparatus 100 has an optical system 102 containing an optical pickup, an optical disc control device 104, a motor 106, and an optical disc recording medium 108.

The optical disc recording medium 108 is driven to rotate by the motor 106 and reflects a laser beam emitted from the optical system 102 containing the optical pickup. Information of pits in the optical disc recording medium 108 is contained in the laser beam reflected. This reproduction optical signal returns once again to the optical disc recording medium 108 and is converted into an electric reproduction signal, that is, the reproduction RF signal SIN, by the optical detection device of the optical system 102 containing the optical pickup and then is input into the waveform equalization circuit (equalization: EQL) 12 in the of preprocessing circuit 10.

In other words, the optical system 102 containing the optical-pickup reads a reproduction optical signal from the optical disc recording medium 108 and outputs it as the reproduction RF signal SIN. The optical disc recording medium 108 has the digital data encoded by the blocking (4, 22; 2, 4; 5) RLL encoding system recorded on it by the NRZI format with a shortest pit of 5 periods (5T) of clock signals.

The preprocessing circuit 10 has the waveform equalization circuit (equalizer: EQL) 12, an automatic gain control circuit (AGC) 14, and a low pass filter (LPF) 16.

The EQL circuit 12 carries out processing for equalization of the reproduction RF signal SIN.

The AGC circuit 14 amplifies the reproduction RF signal SIN by the amplification degree corresponding to the amplitude of the reproduction RF signal SIN which was equalized in waveform.

The LPF 16 will only allow a signal component less than a predetermined frequency of the reproduction RF signal SIN which has been processed to pass and supplies it as a PLL input signal S30 to the hybrid PLL circuit 30A.

The hybrid phase locked loop (PLL) circuit 30A of the second embodiment has an analog/digital conversion circuit (ADC) 32, a phase error calculation means 34, a VCO control voltage generating circuit 36A, and an analog voltage-controlled type oscillating circuit (VCO) 38.

In this embodiment, a level comparison circuit 20 is provided as the data discrimination circuit 20A shown in FIG. 2 for discriminating the data based on the output data of the ADC circuit 32.

An output signal of the LPF 16 is applied to the ADC circuit 32 as the PLL input signal S30 and is sampled by a reproduction synchronization clock signal CLK from the analog VCO circuit 38. In the same way as in the first embodiment, the sampling result is compared in level at the level comparison circuit 20A, the data is reproduced, and the phase error is detected and the phase error signal S34 output in the phase error calculation means 34 as explained with reference to FIGS. 5A to 5C to 7.

In other words, the analog/digital conversion circuit (ADC) 32 samples the phase locked loop (PLL) input signal S30 applied from the low pass filter (LPF) 16 at a rising edge of the reproduction synchronization clock signal CLK from the analog voltage-controlled type oscillating circuit (VCO) 38 and converts it into a digital reproduction signal d(k) (where, k is an integer) and supplies it to the level comparison circuit 20A and phase error calculation means 34.

The frequency $f_{clock}$ of the reproduction synchronization clock signal CLK is a frequency greater than 2 times the cutoff frequency $f_c$ of the reproduction RF signal SIN, so it is possible to perform analog/digital conversion of the reproduction RF signal SIN in the ADC circuit 32 without loss of the information contained in the reproduction RF signal SIN.

In other words, the ADC circuit 32 converts the reproduction RF signal SIN into a digital signal at a rising edge of the reproduction synchronization clock signal CLK from the analog VCO circuit 38 as shown in FIG. 5C.

Note that the ADC circuit 32 does not necessarily have to sample the reproduction signal at the frequency of the reproduction synchronization clock signal CLK. For example, when the frequency $f_{clock}$ of the reproduction synchronization clock signal CLK is 10 times the cutoff frequency $f_c$, it may perform sampling of the reproduction signal, for example, at a frequency of 2 or more times the cutoff frequency $f_c$, for example, 5 times it.

As shown in FIG. 6A to 6F, the phase error calculation means 34 detects a point of change of the reproduction RF signal SIN, carries out the phase error detection processing shown in FIG. 7 based on the values of the digital reproduction signals before and after the point of change, and outputs the phase error signal S34 to the VCO control voltage generating circuit 36A.

The level comparison circuit 20A compares the value of the digital reproduction signal d(k) from the analog/digital conversion circuit (ADC) 32 with a predetermined threshold value to reproduce the reproduction data and outputs it as the data output of the clock signal reproduction and data reproduction circuit.

The VCO control voltage generating circuit 36A of the second embodiment has a first circuit 36A1 comprised of a digital integration circuit 361 for integrating the digital phase error signal S34, a first digital/analog conversion circuit 362, a first smoothing filter 363 for smoothing the output of the digital/analog conversion circuit (DAC) 362, and a first coefficient multiplication and amplification circuit 364. The VCO control voltage generating circuit 36A has a second circuit 36A2 comprised of a second digital/analog conversion circuit (DAC) 365, a second smoothing filter 366, and a second coefficient multiplication and amplification circuit 367. Further, the VCO control voltage generating circuit 36A has an addition circuit 368. The smoothing filter 363 can be omitted and can be included in the DAC circuit 362. The smoothing filter 366 can be omitted or included in the DAC circuit 365 in the same way.

An explanation will be give here of the general operation of the circuits of the VCO control voltage generating circuit 36A. The first circuit 36A1 integrates the phase error signal S34 over the integration circuit 361 and multiplies the integrated result with the first coefficient α of the first coefficient multiplication and amplification circuit 364. The second circuit 36A2 multiplies the instant value of the phase error signal S34 by the second coefficient β in the second coefficient multiplication and amplification circuit 367. In other words, the first circuit 36A1 integrates the phase error signal S34 over a certain period to calculate an average phase error and multiplies the average phase error with the first coefficient α. The second circuit 36A2 multiplies an instant value of the phase error signal S34 with the second coefficient β. The addition circuit 368 adds the result of the first circuit 36A1 and the result of the second circuit 36A2. Consequently, the analog control voltage signal S36 corresponding to a phase error taking in consideration both the average phase error of one period and an instant phase error is output from the addition circuit 368.

The first DAC circuit 362 and the second DAC circuit 365 convert the mean value of the phase error signal S34 and the instant value of the phase error signal S34 into analog signals.

The first smoothing filter 363 and the second smoothing filter 366 smooth the discrete outputs of the DAC circuit 362 and 365.

The first coefficient multiplication and amplification circuit 364 and the second coefficient multiplication and amplification circuit 367, as mentioned above, function as a coefficient multiplication circuit and an amplitude amplification circuit.

Note that the output results of the first DAC circuit 362 and the second DAC circuit 365 become discrete values. Accordingly, use was made of the first smoothing filter 363 and the second smoothing filter 366 to get a continuous output, but it is also possible to provide a continuous analog output signal by incorporating a smoothing filter circuit using an operational amplifier circuit, capacitors, and resistors in the first DAC circuit 362 and the second DAC circuit 365 instead of the smoothing filters.

It is also possible to provide a digital smoothing filter between the digital integration circuit 361 and the first DAC circuit 362 instead of the first smoothing filter 363 and to provide a digital smoothing filter before the second DAC circuit 365. The function is substantially no different from the above.

In the clock signal reproduction circuit of the second embodiment illustrated in FIG. 8, the result of integration of the phase error signal S34 and the instant value of the phase error signal S34 were combined, so it is possible to reproduce a reproduction synchronization clock signal CLK with stability over a long period.

Of course, it is possible to freely adjust the control frequency band and the attenuation characteristic of the PLL circuit as desired by choosing the first coefficient α and the second coefficient β.

Since the VCO control voltage generating circuit 36 uses a digital integration circuit 361 for integrating the phase error signal S34, there is no problem of drift and offset. In other words, it is possible to stably obtain accurate integrated results of the phase error signal S34.

As explained above, according to the clock signal reproduction circuit of the second embodiment, it is possible to carry out reproduction of a reproduction synchronization clock signal CLK from a reproduction RF signal SIN by hybrid signal processing. Accordingly, adjustment for drift, correction of offset, and other adjustment work which were required when using an analog signal processing circuit become unnecessary. As a result, it is possible to reproduce a reproduction synchronization clock signal CLK stably and in turn to stably reproduce data in the level comparison circuit 20A.

This clock signal reproduction circuit is resistant to the effects of drift caused by a temperature change and is superior in resistance to the environment.

Also, compared with the full digital clock signal reproduction circuit mentioned before, it can set the maximum operation frequency of the clock signal reproduction circuit of the present embodiment at a low level, and in particular, the clock signal reproduction circuit which reproduces a synchronization clock signal at a high frequency can be produced at low costs.

This clock signal reproduction circuit can also be applied to applications other than reproduction of a reproduction synchronization clock signal CLK of an optical disc apparatus 100, for example, applications for reproducing a clock signal from a signal received from a telecommunication line.

Furthermore, this clock signal reproduction circuit may be used for applications for reproducing data recording digital data and clock signals in an optical disc apparatus encoded by an encoding system other than the blocking (4, 22; 2, 5; 5) RLL encoding system or for applications for reproducing from a magnetic recording medium.

Of course, the signal waveforms, logical values, frequencies, etc. of the parts of the above clock signal reproduction circuit were all illustrations.

Third Embodiment

Figure 9:
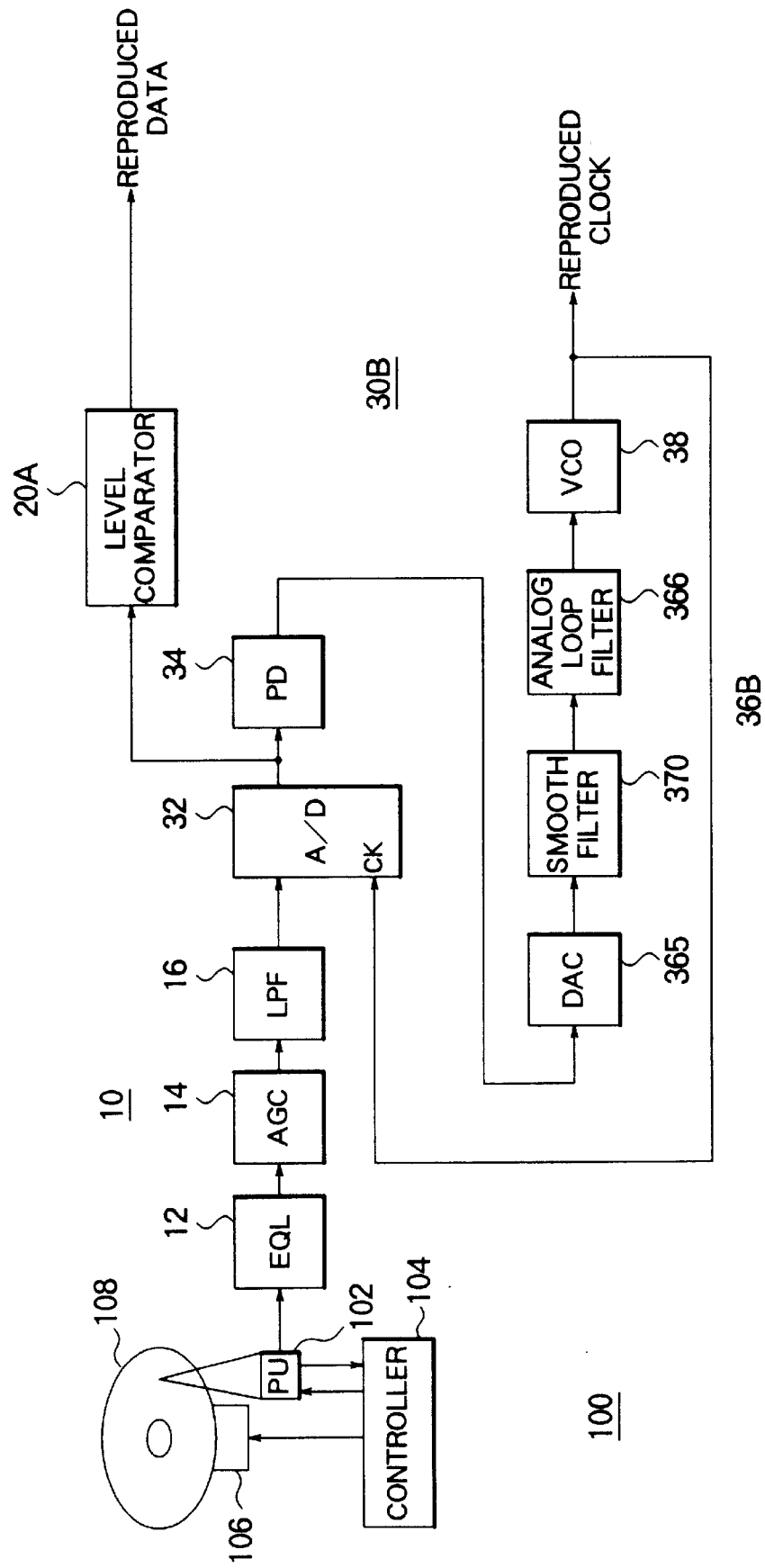
FIG. 9 is a view of the configuration of a clock signal reproduction circuit applied to an optical disc apparatus. The clock signal reproduction circuit uses a VCO control voltage generating circuit shown in FIG. 2A as a third embodiment of clock signal reproduction circuit of the present invention.

FIG. 9 is a circuit diagram of a clock signal reproduction circuit applied to an optical disc apparatus as the third embodiment of a clock signal reproduction circuit of the present invention.

This hybrid PLL circuit 30B has an ADC circuit 32, a phase error calculation means 34, a VCO control voltage generating circuit 36B, and an analog VCO circuit 38.

The VCO control voltage generating circuit 36B has a DAC circuit 365, a filter circuit 370 is provided, and an analog loop filter circuit 366. In other words, in FIG. 9, of a filter circuit 370 after the second DAC circuit 365 so as to smooth the output voltage of the second DAC circuit 365 and supply the result to the second loop filter 366.

This clock signal reproduction circuit makes the frequency $f_{clock}$ of the reproduction synchronization clock signal CLK at least 2 times the cutoff frequency $f_c$ of the reproduction signal.

The clock signal reproduction circuits shown in FIG. 3A and FIG. 9 exhibit similar effects as the first embodiment and the second embodiment.

Fourth Embodiment

An explanation will now be given of a fourth embodiment of a clock signal reproduction circuit of the present invention.

The phase locked loop (PLL) circuits as described above in the first to third embodiments, basically, detect a phase difference between a signal obtained by converting a reproduction RF signal SIN into a digital format and the reproduction synchronization clock signal CLK, control the frequency or phase of the reproduction synchronization clock signal CLK so the phase difference becomes zero or a constant value, and thereby obtain the correct synchronization. It is difficult or impossible to pull-in to a state giving correct synchronization if the frequency of the synchronization clock signal sought in the PLL circuit and the frequency of the reproduction synchronization clock signal CLK produced by the PLL circuit differ by more than a certain range. Therefore, a synchronization clock signal reproduction circuit is often provided with some sort of frequency control circuit along with a phase locked loop (PLL) circuit. For example, in general, a method is used in which a trigonometric wave sweeping voltage is applied to a control input terminal of a voltage-controlled type oscillator (VCO) producing the reproduction synchronization clock signal CLK to sweep the oscillating frequency of the oscillator from the upper limit to the lower limit.

There are at least the following problems in the method mentioned above.

(1) The input digital signal often includes a spurious component in addition to the inherent frequency component of the synchronization clock and there is a chance of being pulled-in to that spurious component. Also, once this spurious component is pulled into and locked to, it will end up being impossible to lock on to the frequency of the correct synchronization clock until either the strength of this spurious component falls or an outside disturbance is supplied for forcibly releasing this locked state.

(2) The time that is necessary to pull-in the frequency is limited due to the frequency sweep time. As a result, the time required to pull-in the frequency is long.

The fourth embodiment of the clock signal reproduction circuit of the present invention solves the above problems.

Figure 10:
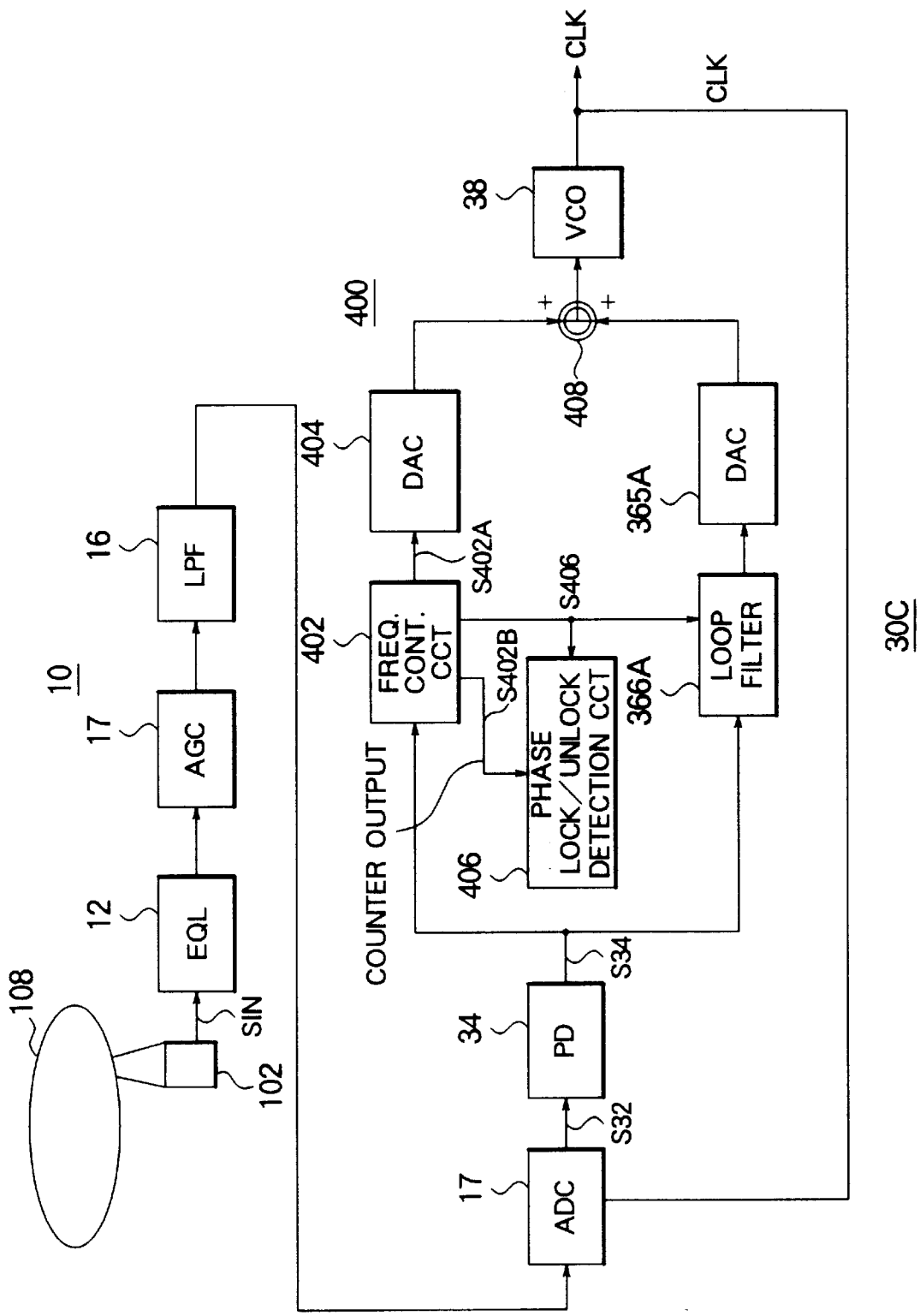
FIG. 10 is a view of the configuration of a clock signal reproduction circuit applying to an optical disc apparatus a clock signal reproduction circuit provided with a synchronization pull-in control circuit as a fourth embodiment of a clock signal reproduction circuit of the present invention.

FIG. 10 is a view of the configuration of the case of applying a clock signal reproduction circuit of the fourth embodiment of the present invention to an optical digital video disc reproduction apparatus.

The hybrid PLL circuit 30C serving as the fourth embodiment has a synchronization pull-in control circuit 400 in addition to an analog/digital conversion circuit 32, a digital phase error calculation means 34, a digital loop filter 366A, a DAC circuit 365A, and an analog VCO circuit 38.

The synchronization pull-in control circuit 400 has a frequency control circuit 402, a second DAC circuit 404, and a phase synchronization/asynchronization detection circuit 406.

The digital loop filter 366A and the DAC circuit 365A are substantially the same as the circuit configuration of the VCO control voltage generating circuit 36C containing the loop filter and the DAC circuit illustrated in FIG. 3B. In other words, a circuit constituted by the analog/digital conversion circuit (ADC) 32, phase error calculation means 34, digital loop filter 366A, DAC circuit 365A, and analog VCO circuit 38 is substantially the same as the circuit described in the third embodiment.

The hybrid PLL circuit 30C of the fourth embodiment adds the synchronization pull-in control circuit 400 to the hybrid PLL circuit 30B of the third embodiment.

The reproduction signal (reproduction RF signal SIN) subjected to the clock signal reproduction is modulated by a self synchronizable modulation system and is reproduced using the optical system 102 containing the optical pickup from the optical disc recording medium 108.

The reproduction signal is pre-processed through the waveform equalization circuit (equalization: EQL) 12, automatic gain control circuit (AGC) 14 and low pass filter (LPF) 16 in the pre-processing circuit 10.

An analog output signal of the LPF 16 is sampled at the ADC circuit 32 based on the reproduction synchronization clock signal CLK from the analog VCO circuit 38. The sampled digital signal S32 is applied to the phase error calculation means 34. At the phase error calculation means 34, phase error detection is carried out as explained with reference to FIGS. 6A to 6F and FIG. 7. In other words, the phase error calculation means 34 outputs a phase error signal S34 using as a phase error the sum of the sampling value d(i−1) of right before the zero cross point of the reproduction RF signal SIN and sampling value d(i) right after the zero cross point. Note that in phase error detection, the rising edge and the trailing edge are given inverse signs.

The reproduction RF signal SIN (reproduction signal) is band restricted by the cutoff frequency determined by the numerical aperture (NA) of the objective lens of the optical pickup in the optical system 102 containing the optical pickup and the wavelength of the laser beam. If the sampling frequency is sufficiently larger than the upper limit of this band, as mentioned earlier, the reproduction signal may be deemed to be substantially linear near the zero cross point. Accordingly, if the state where the zero cross point is in exactly the middle of the sampling points is made the state of zero phase error, it is possible to consider the sum of the sampling values before and after the zero cross point to be proportional to the value of the phase error. Accordingly, the phase error calculation means 34 has a linear phase comparison characteristic in the range of the phase error of $\pi(rad)$ to $-\pi(rad)$.

Figures 11A, 11B:
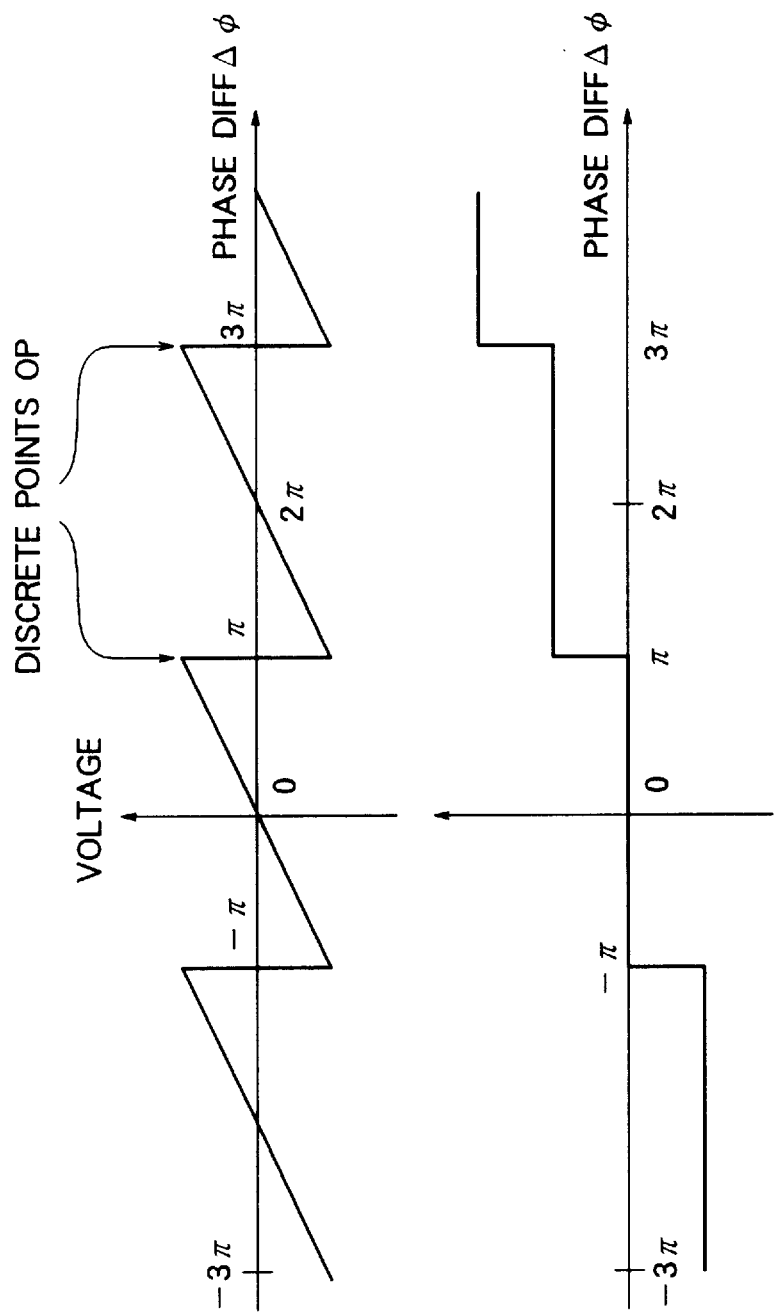
FIGS. 11A and 11B are graphs illustrating the operation of the synchronization pull-in control circuit of the clock signal reproduction circuit shown in FIG. 1.

FIGS. 11A and 11B are graphs showing examples of the sampling points in the case of a negative, zero, and positive phase error $\Delta\Phi$. The vertical axis shows the voltage corresponding to the phase error $\Delta\Phi$ and the horizontal axis shows the elapse of time.

The digital phase error $\Delta\Phi$ calculated in the phase error calculation means 34 is output as the phase error signal S34 and supplied to the digital filter 366A and the frequency control circuit 402.

An explanation will now be given of the principle of production of the frequency control signal.

When in the phase non-synchronization state, the phase error signal S34 from the phase error calculation means 34 shows the periodic change illustrated in FIG. 11A. FIG. 11A corresponds to the case where the frequency $f_{ck}$ of the synchronization clock signal to be sought and the frequency $f_{p11}$ of the reproduction synchronization clock signal CLK produced from the hybrid PLL circuit 30C, that is, the analog VCO circuit 38, are in the relationship of $f_{ck} > f_{p11}$. Accordingly, by taking note of the discontinuity points DP which change discontinuously, it is possible for the frequency control circuit 402 to produce a step-like signal as shown in FIG. 11B corresponding to the phase error $\Delta\Phi$ of FIG. 11A.

Figure 12:
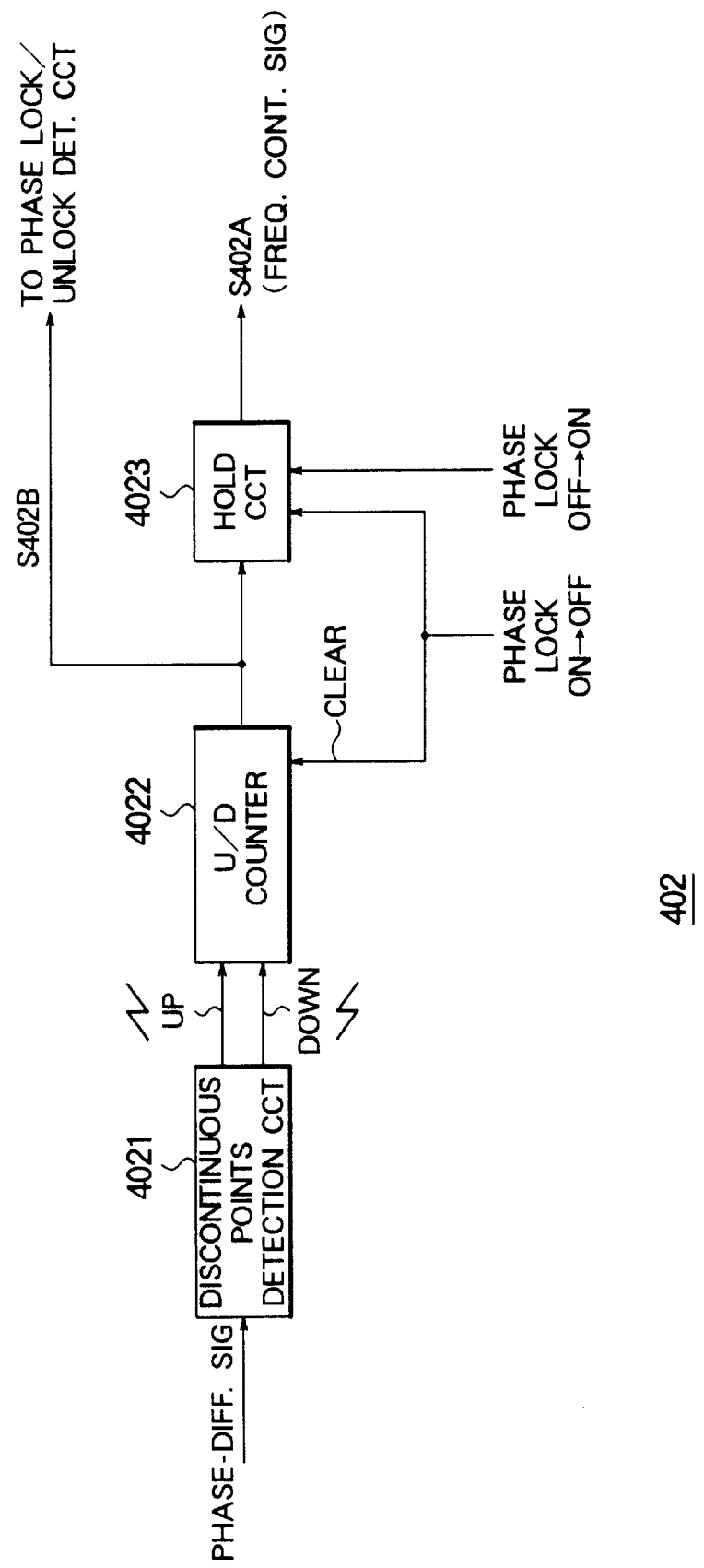
FIG. 12 is a view of the circuit configuration of a frequency control circuit of the synchronization pull-in control circuit illustrated in FIG. 1.

The circuit configuration of the frequency control circuit 402 is shown in FIG. 12.

The frequency control circuit 402 has a discontinuity point detection circuit 4021, up/down (U/D) counter 4022, and hold circuit 4023. The discontinuity point detection circuit 4021 receives as input a phase error signal S34 from the phase error calculation means 34 and detects a point of discontinuity as is illustrated in FIG. 11A. That is, the discontinuity point detection circuit 4021 detects the point of change of the phase error ($\Delta\Phi$) from $-\pi(rad)$ to $\pi(rad)$ (positive point of discontinuity of phase error), that is, the point of change to the up side (timing) or the point of change to the down side (timing), obtains the difference between the phase error value and the phase error value just before, and when the difference is more than a certain magnitude, detects it as a point of discontinuity of the phase error and outputs an up (positive) discontinuity point detection signal or a down (negative) discontinuity point detection signal to the U/D counter 4022.

The U/D counter 4022 increases the count value when an up (positive) discontinuity point detection signal is supplied and reduces the count value when a down (negative) discontinuity point detection signal is supplied. This calculation value is supplied as the up/down calculation signal S402B to the hold circuit 4023 and phase synchronization/asynchronization detection circuit 406.

The hold circuit 4023 affixes the frequency control signal after the frequency synchronization and holds the up/down calculation signal S402B. This held result is supplied to the second DAC circuit 404 as the held up/down calculation signal S402A.

Note that the phase synchronization/asynchronization detection circuit 406 receives as input the up/down calculation signal S402B from the U/D counter 4022 in the frequency control circuit 402 and detects if the phase is synchronized. If it is not in a state where the phase is synchronized, that is, if shifting to a state of phase synchronization ON to OFF, it outputs a signal S406 of the off level, clears the U/D counter 4022, and releases the hold of the hold circuit 4023. On the other hand, when the phase synchronization/asynchronization detection circuit 406 judges that synchronization has been established from a state where the phase was not synchronized, it outputs a signal S406 of an ON level and makes the hold circuit 4023 hold the up/down calculation signal S402B from the U/D counter 4022.

An explanation will now be given of the operation of the fourth embodiment as shown in FIG. 10.

When the optical system 102 containing the optical pickup reads the reproduction signal from the optical disc recording medium 108, first the phase synchronization/asynchronization detection circuit 406 enters the "frequency pull-in model". In the frequency pull-in mode, the output of the loop filter 366A is fixed to 0 by the off level signal S406 from the phase synchronization/asynchronization detection circuit 406. The phase synchronization/asynchronization detection circuit 406 monitors the signal S402B and decides that the frequency pull-in has become complete when the change of the counter output of the U/D counter 4022 of the frequency control circuit 402 falls within a set range.

When the frequency pull-in is completed, the count value of the U/D counter 4022 is held by the signal S406 of the on level output from the phase synchronization/asynchronization detection circuit 406 in the hold circuit 4023 of the frequency control circuit 402. The "phase pull-in mode" is entered by freeing the output of the loop filter 366A.

In the phase pull-in mode, the correct phase synchronization state is immediately entered since the frequency of the synchronization clock signal to be found and the frequency of the reproduction synchronization clock signal CLK already substantially match.

In the phase pull-in state too, the counter 4022 of the frequency control circuit 402 continues counting. When the count value goes out of the set range, the phase synchronization/asynchronization detection circuit 406 judges the phase to no longer be synchronized.

When loss of phase synchronization is detected by the phase synchronization/asynchronization detection circuit 406, the hold circuit 4023 is reset by the signal S406 of the off level output from the phase synchronization/asynchronization detection circuit 406, the hold state of the frequency control signal is released, and the frequency pull-in state is again entered.

Referring to the circuit of FIG. 10, first frequency pull-in is performed by the route of the frequency control circuit 402, the digital/analog conversion circuit (DAC) 404, and the addition circuit 408.

When frequency pull-in comes to an end, use is made of a signal of the route of the frequency control circuit 402 and DAC circuit 404 in addition to a signal of the route of the loop filter 366A and DAC circuit 365 to carry out the phase synchronization.

In this way, the fourth embodiment pays attention to a change of phase difference between an input reproduction signal and a reproduction synchronization clock signal CLK to perform frequency pull-in control and thereby obtains the following effects:

(1) Even when a spurious component is included in the input reproduction signal in addition to the inherent frequency component of the synchronization clock signal, the spurious component is never pulled-in to; and (2) The time required for frequency pull-in is short.

The fourth embodiment is not limited to the above-mentioned circuit configurations and may be modified in various ways. For example:

(a) The detection of the phase synchronization/asynchronization in the phase synchronization/asynchronization detection circuit 406 may be performed using the phase error signal S34 directly instead of the signal S402B from the frequency control circuit 402;

(b) At the time of phase synchronization, the hold circuit 4523 in the frequency control circuit 402 does not hold the output of the frequency control signal; or (c) The phase synchronization and/or asynchronization is detected by the value counted by the counter 4022 of the frequency control circuit 402 in a certain period.

A concrete explanation will now be given of an example of these modifications.

Figure 13:
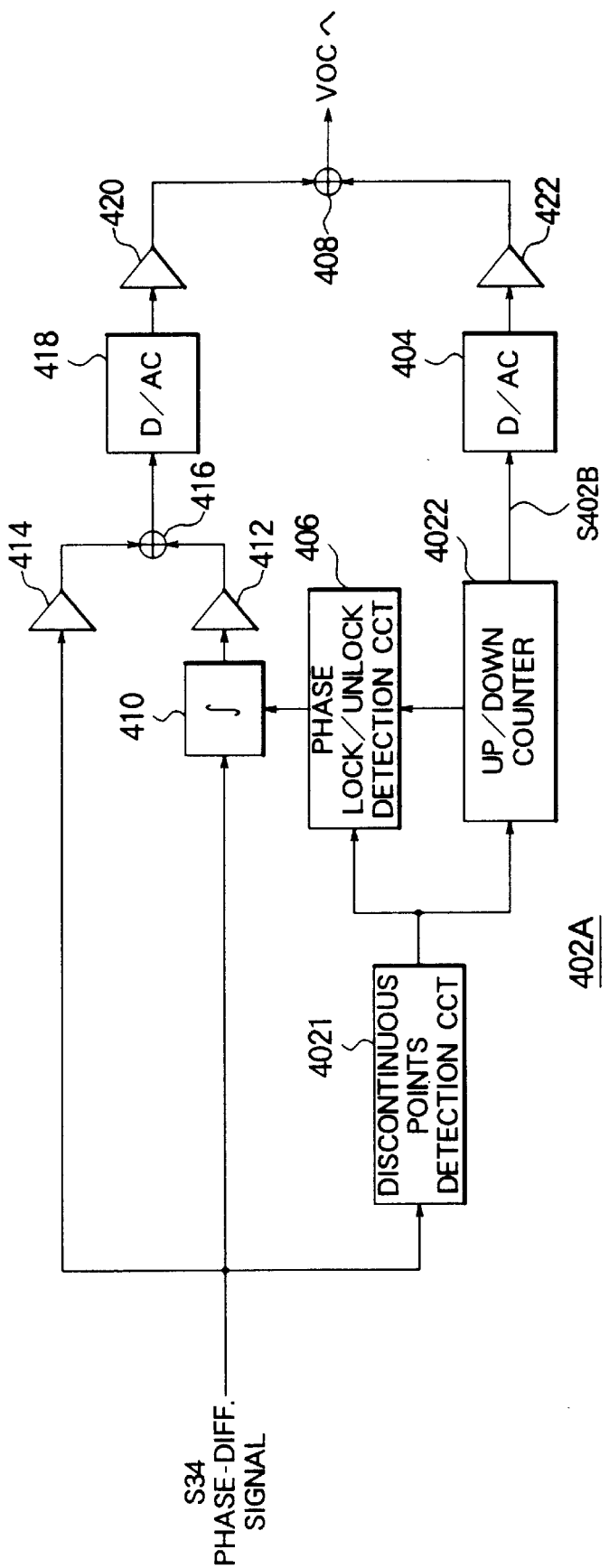
FIG. 13 is a view of the circuit configuration showing a first modification of a clock signal reproduction circuit of the fourth embodiment as shown in FIG. 1.

FIG. 13 shows the circuit configuration relating to the above-mentioned (b). It eliminates the hold circuit 4023 from the frequency control circuit 402 illustrated in FIG. 11 and comprised of the discontinuity point detection circuit 4021, counter 4022, and hold circuit 4023 and inputs the output signal S402B of the counter 4022 into the second DAC circuit 404 directly.

Further, instead of the loop filter 366A and DAC circuit 365, the circuit configuration resembles the circuit illustrated in FIG. 8. In other words, it integrates the phase error signal S34 in the digital integration circuit 410 corresponding to the digital integration circuit 361 of FIG. 8, multiplies this integrated result with the coefficient a at the coefficient multiplication circuit 412, multiplies the instant value of the phase error signal S34 at the coefficient multiplication circuit 414 with the coefficient $\beta$, and adds these at the addition circuit 416. The result of the addition is converted into an analog signal at the digital/analog conversion circuit (DAC) 418.

The result obtained by multiplying the output signal of DAC circuit 418 with the coefficient $\gamma$ in the analog coefficient multiplication circuit 420 and the result obtained by multiplying the output signal of DAC circuit 404 with the coefficient $\delta$ in the analog coefficient multiplication circuit 4522 are added at the addition circuit 408 and supplied as the control voltage to the analog VCO circuit 38.

When the phase synchronization is lost, the phase synchronization/asynchronization detection circuit 406 resets the value of the digital integration circuit 410 and resets a count value of the U/D counter 4022 simultaneously. In other words, the digital integration circuit 410 is controlled to operate or not to operate by the phase synchronization/asynchronization detection circuit 406 as with the hold circuit 4023 and loop filter 366A.

The circuit of FIG. 13 has the advantages explained with reference to FIG. 10 in addition to having the same type of advantages as explained referring to FIG. 8.

Figure 14:
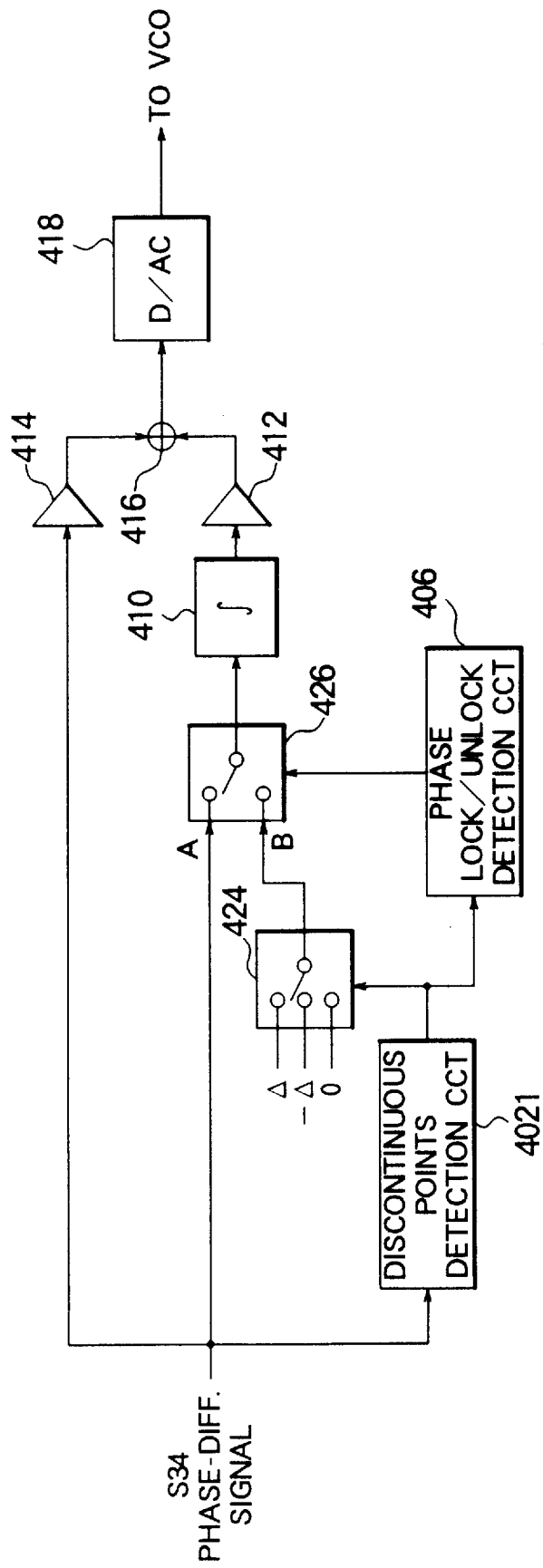
FIG. 14 is a view of the circuit configuration showing a second modification of a clock signal reproduction circuit of a fourth embodiment as shown in FIG. 10.

FIG. 14 shows another modification.

This circuit uses the discontinuity point detection circuit 4021 and phase synchronization/asynchronization detection circuit 406 to select the input of the digital integration circuit 410 shown in FIG. 12.

A value of 0 showing no phase error, a positive phase error Δ, or a negative phase error −Δ is input into the first switch circuit 424. One of these is selected by the detection signal of the discontinuity point detection circuit 4021.

On the other hand, the selected output of the first switch circuit 424 of the phase error signal S34 is supplied to the second switch circuit 426.

When the phase synchronization/asynchronization detection circuit 406 judges that synchronization is lost, the contact B of the second switch circuit 426 is energized and the selected output of the first switch circuit 424 is input into the digital integration circuit 410.

When the phase synchronization/asynchronization detection circuit 406 judges that synchronization is established, the contact A of the second switch circuit 426 is energized and the phase error signal S34 is input into the digital integration circuit 410.

In other words, use is made of the selected output of the first switch circuit 424 to quickly pull in the synchronization in the case of asynchronization and when the synchronization pull-in is completed, use is made of just the phase error signal S34 to operate the analog VCO circuit 38.

Fifth Embodiment

An explanation will now be given of the fifth embodiment of a clock signal reproduction circuit of the present invention referring to FIG. 15.

When the upper limit of the frequency band of the reproduction RF signal is restricted below 1/(2n) of a channel clock frequency of the digital data to be reproduced, where n is an integer equal to or greater than 2, the clock signal reproduction circuit of the fifth embodiment aims at reducing the operation frequency in a hybrid PLL circuit by interpolation of the sampling result of the reproduction RF signal SIN.

Figure 15:
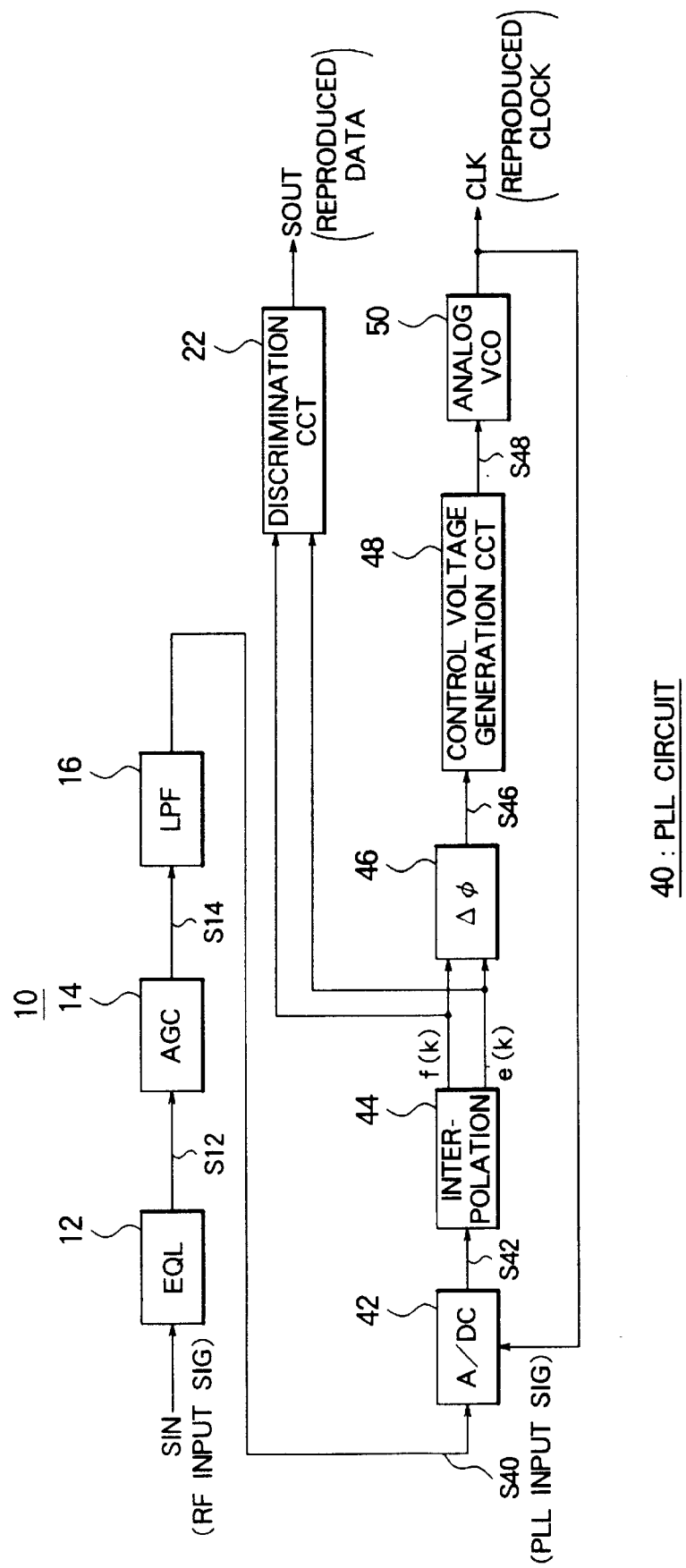
FIG. 15 is a view of the configuration of a is clock signal reproduction-circuit provided with an interpolation circuit as the fifth embodiment of a clock signal reproduction circuit of the present invention.

FIG. 15 is a view of the circuit configuration of a clock signal reproduction circuit.

Figure 16A:
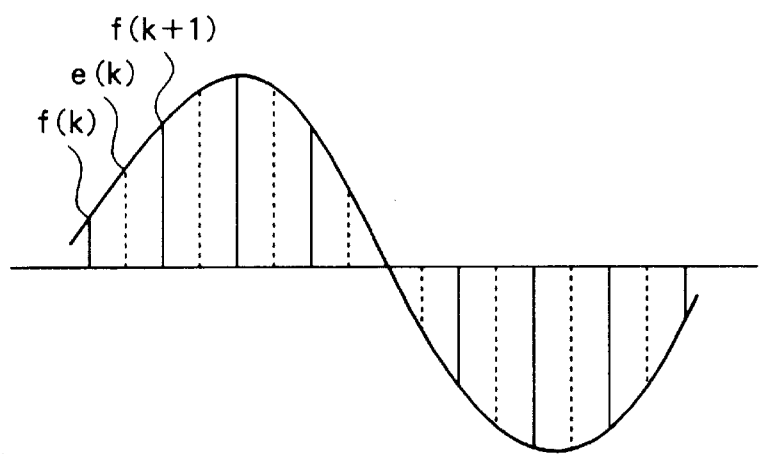
FIGS. 16A and 16B are graphs of the interpolation operation of an interpolation circuit in the clock signal reproduction circuit shown in FIG. 1.
Figure 16B:
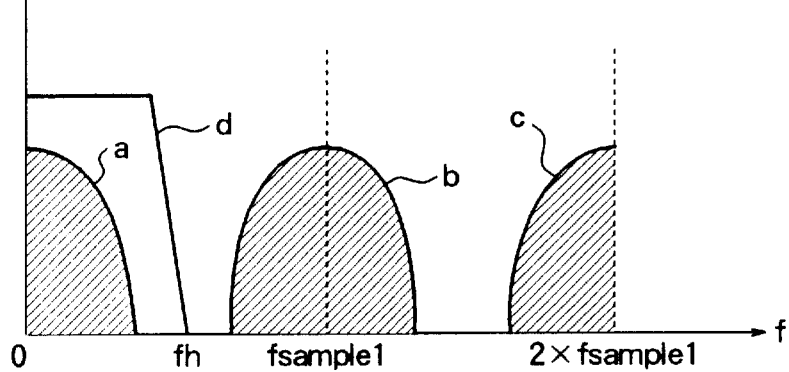

FIGS. 16A and 16B are graphs showing the operation of the clock signal reproduction circuit.

The clock signal reproduction circuit has a pre-processing circuit 10 and a hybrid PLL circuit 40.

The pre-processing circuit 10, like that illustrated in FIG. 2, is a circuit for pre-processing the reproduction RF signal SIN and has a waveform equalization circuit (equalization: EQL) 12, an automatic gain control circuit (AGC) 14, and a low pass filter (LPF) 16.

The hybrid PLL circuit 40 has an ADC circuit 42, an interpolation circuit 44, a phase error calculation means 46, a VCO control voltage generating circuit 48 containing a loop filter, a DAC circuit and an analog VCO circuit 50.

Further, it is possible to construct a clock signal reproduction and data reproduction circuit by adding a data discrimination circuit 22 to the above clock signal reproduction circuit.

The pre-processing circuit 10 is similar to that explained referring to FIG. 2, so the explanation of the circuit operation of the pre-processing circuit 10 will be omitted.

The hybrid PLL circuit 40, compared with the hybrid PLL circuit 30 explained with reference to FIG. 2, is substantially equal to the hybrid PLL circuit 30 except that provision is made of an interpolation circuit 44 between the ADC circuit 42 and the phase error calculation means 46. In other words, the ADC circuit 32 of the hybrid PLL circuit 30 and the ADC circuit 42 of the hybrid PLL circuit 40, the phase error calculation means 34 and phase error calculation means 46, the VCQ control voltage generating circuit 36 and VCQ control voltage generating circuit 48, and the analog VCO circuit 38 and analog VCO circuit 50, respectively, each correspond in the two embodiments. The basic operations of these corresponding circuits are similar to those explained above. Note, the VCO control voltage generating circuit 48 can be any one of the VCO control voltage generating circuits 36', 36", 36A, and 36B shown in FIGS. 3A, 3B, 8, and 9.

In the hybrid PLL circuit 30, however, it was necessary that the frequency $f_{clock}$ of the reproduction synchronization clock signal CLK be equal to the channel clock frequency of the digital data to be reproduced. However, in the hybrid PLL circuit 40, since the interpolation circuit 44 is provided for interpolation of signals, if the frequency $f_{clock}$ of the reproduction synchronization clock signal CLK is equal to or higher than 2n times the cutoff frequency $f_c$, where n is an integer equal to or greater than 2, the frequency $f_{clock}$ of the reproduction synchronization clock signal CLK can be set 1/(2n) of the channel clock frequency of the digital data to be reproduced. This means that the operating frequencies of the ADC circuit 42, phase error calculation means 46, VCO control voltage generating circuit 48, and analog VCO circuit 50 may be made advantageously low as well. In other words, the ADC circuit 42, phase error calculation means 46, VCO control voltage generating circuit 48 and analog VCO circuit 50 can operate at a low speed. That is, there is at least the advantage that it is possible to make a circuit configuration with a relatively low price.

An interpolation operation of the interpolation circuit 44 giving rise to the above advantages will now be explained referring to FIGS. 16A and 16B.

When the frequency $f_{clock}$ of the reproduction synchronization clock signal CLK output from the analog VCO 50 is 1/n of the channel clock frequency is of the digital data to be reproduced (where n is an integer equal to or greater than 2), the digital data to be reproduced is sampled only every (n−1), as a result, the data to be reproduced is lost. Alternatively, if the cutoff frequency $f_c$, of the reproduction signal S40 is equal to or less than 1/(2n) of the channel clock frequency of the digital data to be reproduced, the lost data can be interpolated. Namely, if the sampling theorem is satisfied between the frequency $f_{clock}$ of the reproduction synchronization clock signal output from the analog VCO 50 and the cutoff frequency $f_c$ of the reproduction signal S40, the data lost by the sampling can be restored by the interpolation.

A simple example where n=2 will be described below.

FIG. 16A is a graph showing a sampling operation in the ADC circuit 42 when n=2. FIG. 16B is a view showing the frequency distribution of a signal component of a digital reproduction signal before interpolation in the interpolation circuit 44, that is, the frequency distribution of an output signal f(k) of the ADC circuit 42.

As shown in FIG. 16A, the ADC circuit 42 samples the PLL input signal S40 (reproduction signal) from the pre-processing circuit 10 at a rising edge of the reproduction synchronization clock signal CLK from the analog VCO circuit 50. This sampling result is represented by f(k).

The frequency distribution of the signal component in the case of assuming the value of the digital reproduction signal at the middle point of the digital reproduction signal f(k) before interpolation to be 0 becomes the distribution shown in FIG. 16B at a, b and c. On the other hand, the frequency distribution of the signal component in the case of sampling of the reproduction signal S40 at the frequency $f_{sample1}$, which is 2 times the frequency $f_{clock}$ of the reproduction synchronization clock signal CLK, becomes the distribution shown in FIG. 16B at a and c. The signal component of FIG. 16B at c is originally unnecessary.

Therefore, by making the value of the interpolation signal e(k)=0 and extracting the signal component of less than the frequency $f_h$, that is, the signal component of FIG. 16B at a, at the frequency characteristic shown in FIG. 16B at d by digital signal processing to extract the middle signal of the digital reproduction signal f(k) before interpolation, it is possible to obtain the interpolation signal e(k) shown by the dot in FIG. 16A.

The interpolation circuit 44 produces an interpolation signal e(k) through the above-mentioned operation. It combines this with the digital reproduction signal f(k) before interpolation to produce a signal corresponding to the digital reproduction signal d(k), which is the output result of the ADC circuit 32 in the hybrid PLL circuit 30. That is, the digital reproduction signal f(k) before interpolation, which is the result of output of the ADC circuit 42, is interpolated by the interpolation circuit 44. The digital reproduction signal f(k) before interpolation and the interpolation signal e(k) are output from the interpolation circuit 44.

The VCO control voltage generating circuit 48 produces a control voltage for an analog VCO circuit 50 based on the phase error. As the circuit constitution of the VCO control voltage generating circuit 48, it is possible to use any suitable circuit configuration, such as the VCO control voltage generating circuit 36A illustrated in FIG. 8, the VCO control voltage generating circuits 36' and 36" illustrated in FIGS. 3A and 3B, and the circuit configuration illustrated in FIG. 10 and FIG. 12 to FIG. 14.

The analog voltage-controlled type oscillating circuit (VCO) 50 outputs a reproduction synchronization clock signal CLK of a frequency less than 2 times the reproduction synchronization clock signal CLK of the above-mentioned first to third embodiments based on the control voltage from the VCO control voltage generating circuit 48 and supplies it to the ADC circuit 42 as the sampling clock signal CLK.

The fifth embodiment can give similar effects to the first to third embodiments with a hybrid PLL circuit 40 of a low operation frequency.

The data discrimination circuit 22 reproduces the original of the result from the interpolation circuit 44, that is, the digital signal before interpolation and the interpolation signal. The data discrimination circuit 22 has a level comparison circuit for example and compares the digital signal before interpolation and the interpolation signal by a threshold value and outputs binary digital data of 1 or 0 as the reproduction data.

The clock signal reproduction circuit shown in FIG. 15 has the advantage of using the interpolation circuit 44, that is, it has the advantage of being able to construct a clock signal reproduction circuit at a low price by operating at a low frequency, in addition to the same advantages in circuit configuration obtained by use of a hybrid PLL circuit 40.

Note that it is also possible to apply the synchronization pull-in control circuit 400 explained as the fourth embodiment for the clock signal reproduction circuit shown in FIG. 15.

Sixth Embodiment

The concrete circuit configuration of a clock signal reproduction circuit illustrated in FIG. 15 will now be explained as the sixth embodiment referring to FIG. 17.

The sixth embodiment considers application to an apparatus like the optical disc apparatus 100 with the embodiments explained above.

The optical disc apparatus 100, like the one explained above, has an optical system 102 containing an optical pickup, an optical disc control device 104, a motor 106, and an optical disc recording medium 108. These have the same contents as above and so explanations of their operations will be omitted.

The pre-processing circuit 10 has a waveform. equalization circuit (equalization: EQL) 12, AGC circuit 14, and LPF 16. The pre-processing circuit 10 is also similar to the one explained above.

The hybrid PLL circuit 40A has an ADC circuit 42, interpolation filter circuit 44A, phase error calculation means 46, VCO control voltage generating circuit 48A, and analog VCO circuit 50.

The data discrimination circuit 22 has a first level comparison circuit 22A and second level comparison circuit 22B.

Figure 17:
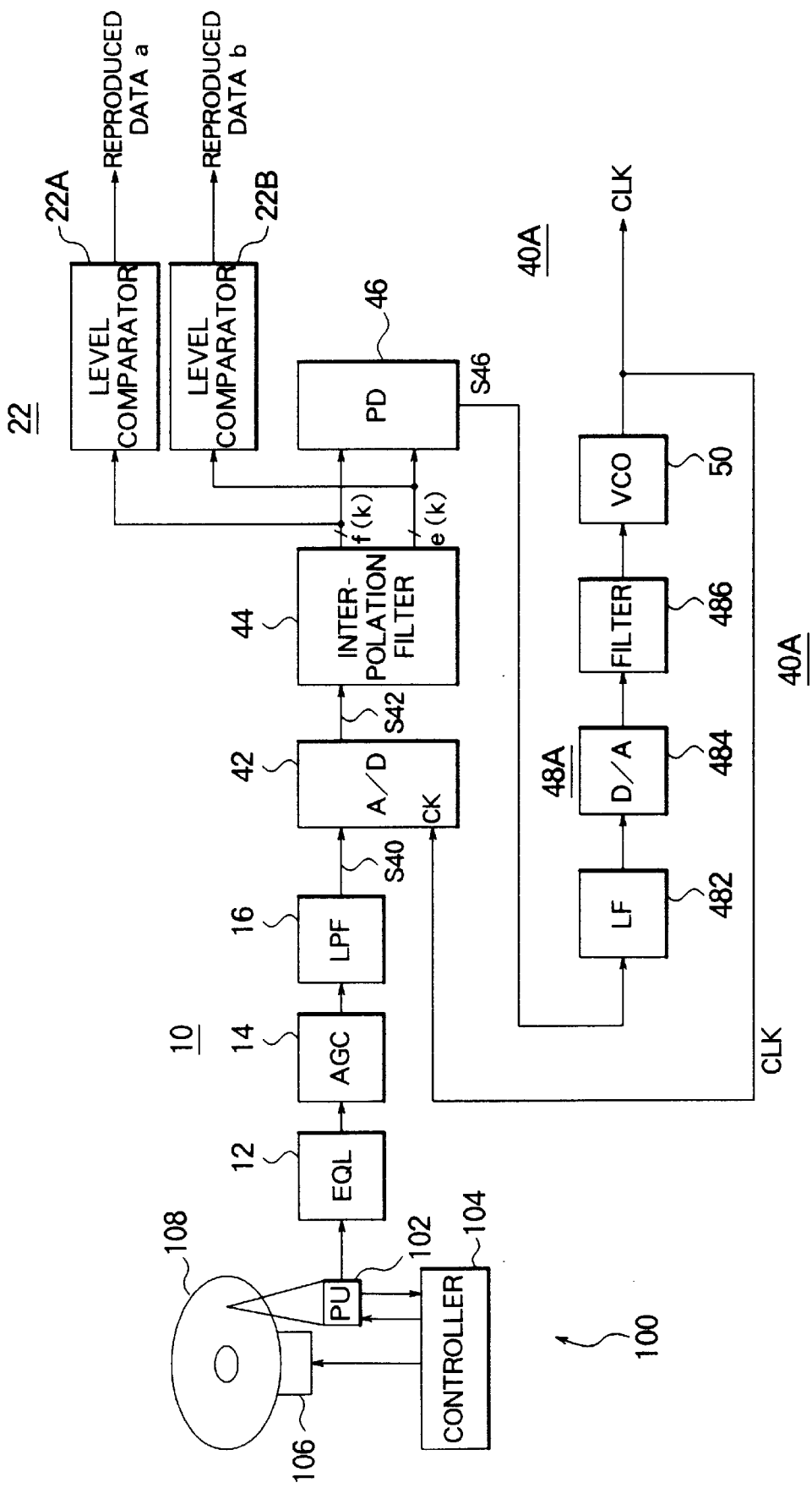
FIG. 17 is a view of the configuration of a clock signal reproduction circuit applied to an optical disc apparatus. The clock signal reproduction circuit is provided with an interpolation circuit as a clock signal reproduction circuit as a sixth embodiment of the present invention.

The interpolation circuit illustrated in FIG. 17 is realized as the interpolation filter circuit 44A, but its operating principle is the same as that explained with reference to FIG. 15. In other words, the digital reproduction signal f(k) before interpolation is interpolated by the interpolation filter circuit 44A and becomes the digital reproduction signals f(k) and e(k) after interpolation. In other words, due to the interpolation filter circuit 44A, the frequency of the reproduction synchronization clock signal CLK can be lowered to 1/(2n) of the channel clock frequency of the digital data to be reproduced.

In this way, the clock signal reproduction circuit of the sixth embodiment can be preferably used for an apparatus such as an optical disc apparatus 100 with a clock frequency lower than a clock signal reproduction circuit of the first embodiment, etc.

The VCO control voltage generating circuit 48A constitutes a digital loop filter circuit 482, a DAC circuit 484, and an analog smoothing filter circuit 486. The digital loop filter circuit 482 is a circuit that extracts a signal corresponding to a voltage signal controlling the analog VCO circuit 50 from a phase error signal S46 which is derived by a phase error calculation means 46. The DAC circuit 484 converts the signal extracted into an analog signal. The smoothing filter circuit 486 makes the discrete signal of the DAC circuit 484 into a smooth signal. Accordingly, a continuous signal is applied to the analog voltage-controlled type VCO circuit 50 and a reproduction synchronization clock signal CLK that can change continuously is reproduced.

The first level comparison circuit 22A compares the digital signal before interpolation with the threshold value and outputs the binary reproduction data. The second level comparison circuit 22B compares the interpolated signal with the threshold value and outputs the binary reproduction data.

In the circuit illustrated in FIG. 17, there is the advantage that provision is made of an interpolation filter circuit 44A in addition to the advantage of constituting hybrid PLL circuit 40.

It is also possible to apply the synchronization pull-in control circuit 400 described in the fourth embodiment to this embodiment.

In employing the clock signal reproduction circuit of the present invention, various modifications are possible not limited to the above circuit configurations. Further when employing the clock signal reproduction circuit of the present invention, it is possible to suitably combine the above-mentioned embodiments. For example, it is possible to add a synchronization pull-in control circuit 400 shown in the fourth embodiment to the clock signal reproduction circuit illustrated in FIG. 2.

As explained above, according to a clock signal reproduction circuit of the present invention, since use is made of a hybrid PLL circuit that combines digital circuits and analog circuits together for production of a reproduction clock from a reproduction signal, there is no effect of drift caused by temperature changes, the trouble of correction of offset is eliminated, and it is possible to maintain stable operation.

Also, the maximum operating frequency of the clock signal reproduction circuit of the present invention, compared with the full digital clock signal reproduction circuit, becomes low. As a result, if the clock signal reproduction circuit of the present invention is applied to a circuit for reproducing a synchronization clock signal having a high frequency, the clock signal reproduction circuit of the present invention can be manufactured at a low cost.

Further, the clock signal reproduction circuit of the present invention uses a synchronization pull-in control circuit which thus enables a faster pull-in operation of the frequency and phase synchronization.

Further, the clock signal reproduction circuit of the present invention can reduce the sampling frequency by using an interpolation circuit. As a result, it becomes possible to use the parts with low operating frequencies and to lower costs even more.

What is claimed is:

1. A clock signal reproduction circuit, where an upper limit of a frequency band of an analog input radio frequency (RF) signal which is encoded by a channel coding is equal to or less than ½ of a channel clock frequency of digital data to be reproduced, said clock signal reproduction circuit reproducing a clock signal from said analog input radio frequency (RF) signal, said clock signal reproduction circuit comprising:

an analog/digital conversion circuit for converting said analog input radio frequency (RF) signal into a digital signal;

digital phase error calculation means for digitally calculating a digital phase error of said digital signal converted in said analog/digital conversion circuit;

control voltage generating means including a loop filter and digital/analog conversion means for outputting an analog control voltage signal based on said digital phase error calculated;

an analog voltage-controlled type oscillating circuit for outputting a reproduction clock signal having a frequency equal to said channel clock frequency of said digital data to be reproduced, said analog/digital conversion circuit using said reproduction clock signal from said analog voltage-controlled type oscillating circuit to convert said analog input RF signal into a digital format;

a first circuit having
a digital integration means for integrating said digital phase error from said digital phase error calculation means to produce a digital integration result,
a first digital/analog conversion circuit for converting said digital integration result into an analog signal, and
a first coefficient multiplication circuit for multiplying with a converted result of said first digital/analog conversion circuit a first coefficient; and a second circuit having
a second digital/analog conversion circuit for converting said digital phase error from said digital phase error calculation means into an analog signal,
a second coefficient multiplication circuit for multiplying with a converted result of said second digital/analog conversion circuit a second coefficient, and
an addition circuit for adding an output of the first circuit and an output of the second circuit and supplying a result to said analog voltage-controlled type oscillating circuit.

2. A clock signal reproduction circuit, where an upper limit of a frequency band of an analog input radio frequency (RF) signal which is encoded by a channel coding is equal to or less than ½ of a channel clock frequency of digital data to be reproduced, said clock signal reproduction circuit reproducing a clock signal from said analog input radio frequency (RF) signal, said clock signal reproduction circuit comprising:

an analog/digital conversion circuit for converting said analog input radio frequency (RF) signal into a digital signal;

digital phase error calculation means for digitally calculating a digital phase error of said digital signal converted in said analog/digital conversion circuit;

control voltage generating means including a loop filter and digital/analog conversion means for outputting an analog control voltage signal based on said digital phase error calculated;

an analog voltage-controlled type oscillating circuit for outputting a reproduction clock signal having a frequency equal to said channel clock frequency of said digital data to be reproduced, said analog/digital conversion circuit using said reproduction clock signal from said analog voltage-controlled type oscillating circuit to convert said analog input RF signal into a digital format;

a frequency control circuit having
a discontinuity point detection circuit for detecting a point of discontinuity by receiving as input a phase error signal from said digital phase error calculation means,
an up/down counter for increasing a count value where the point of discontinuity detected is at an up side and decreasing said count value where it is at a down side, and
a hold circuit for holding a counting result from said up/down counter;

a phase synchronization/asynchronization detection circuit for detecting if a phase of said digital signal is synchronized based on said counting result from said up/down counter in said frequency control circuit, making the loop filter in said control voltage generating means and an integration means inoperative when the phase of said digital signal is not synchronized, clearing the count value of the up/down counter and resetting the counting result held in the hold circuit when shifting to a state away from a phase synchronization state, and holding the counting result from the up/down counter in the hold circuit when shifting from a state out of phase synchronization to a state of phase synchronization;

a third digital/analog conversion circuit for converting an output result of said hold circuit in said frequency control circuit into an analog signal; and a second addition circuit for adding a result of the third digital/analog conversion circuit to the output of said control voltage generating means and supplying the result to said analog voltage-controlled type oscillating circuit.

3. A clock signal reproduction circuit, where an upper limit of a frequency band of an analog input radio frequency (RF) signal which is encoded by a channel coding is equal to or less than ½ of a channel clock frequency of digital data to be reproduced, said clock signal reproduction circuit reproducing a clock signal from said analog input radio frequency (RF) signal, said clock signal reproduction circuit comprising:

an analog/digital conversion circuit for converting said analog input radio frequency (RF) signal into a digital signal;

digital phase error calculation means for digitally calculating a digital phase error of said digital signal converted in said analog/digital conversion circuit;

control voltage generating means including a loop filter and digital/analog conversion means for outputting an analog control voltage signal based on said digital phase error calculated;

an analog voltage-controlled type oscillating circuit for outputting a reproduction clock signal having a frequency equal to said channel clock frequency of said digital data to be reproduced, said analog/digital conversion circuit using said reproduction clock signal from said analog voltage-controlled type oscillating circuit to convert said analog input RF signal into a digital format;

a frequency control circuit having
an up/down counter for detecting a point of discontinuity by receiving as input a phase error signal from said digital phase error calculation means, increasing a count value where the point of discontinuity detected is at an up side, and decreasing the count value where it is at a down side, and
a hold circuit for holding a counting result from said up/down counter;

a phase synchronization/asynchronization detection circuit for detecting if a phase of said digital signal is synchronized based on the counting result from said up/down counter in said frequency control circuit, making the loop filter in said control voltage generating means and an integration means inoperative when the phase of said digital signal is not synchronized, clearing the count value of the up/down counter and resetting the counting result held in the hold circuit when shifting to a state away from a phase synchronization state, and holding the counting result from the up/down counter in the hold circuit when shifting from a state out of phase synchronization to a state of phase synchronization;

a third digital/analog conversion circuit for converting an output result of said hold circuit in said frequency control circuit into an analog signal; and a second addition circuit for adding a result of the third digital/analog conversion circuit to the output of said control voltage generating means circuit and supplying the result to said voltage-controlled type oscillating circuit.

4. A clock signal reproduction circuit, where an upper limit of a frequency band of an analog input radio frequency (RF) signal which is encoded by a channel coding is equal to or less than ½ of a channel clock frequency of digital data to be reproduced, said clock signal reproduction circuit reproducing a clock signal from said analog input radio frequency (RF) signal, said clock signal reproduction circuit comprising:

an analog/digital conversion circuit for converting said analog input radio frequency (RF) signal into a digital signal;

digital phase error calculation means for digitally calculating a digital phase error of said digital signal converted in said analog/digital conversion circuit:

control voltage generating means including a loop filter and digital/analog conversion means for outputting an analog control voltage signal based on said digital phase error calculated;

an analog voltage-controlled type oscillating circuit for outputting a reproduction clock signal having a frequency equal to said channel clock frequency of said digital data to be reproduced, said analog/digital conversion circuit using said reproduction clock signal from said analog voltage-controlled type oscillating circuit to convert said analog input RF signal into a digital format;

said control voltage generating means further including,
a discontinuity point detection circuit for detecting a point of discontinuity by receiving as input a phase error signal from said digital phase error calculation means,
a first switch circuit for selectively switching and outputting a selected output having a positive predetermined value, the second predetermined value, and a value of zero according to processing of the discontinuity point detection circuit,
a second switch circuit for selecting and outputting a phase error signal from said digital phase error signal from said phase error calculation means and the selected output of said first switch circuit,
a phase synchronization/asynchronization detection circuit for detecting if a phase of said digital signal is synchronized based on the point of discontinuity detected by said discontinuity point detection circuit, which causes the selected output of the first switch circuit to be output from said second switch circuit when the phase of said digital signal is not synchronized, and which causes the phase error signal to be output from said second switch circuit when the phase of said digital signal is synchronized,
a digital integrating means for integrating an output of the second switch circuit and producing a digitally integrated result,
a first coefficient multiplication means for multiplying a first coefficient with the digitally integrated result to produce a first multiplication output,
a second coefficient multiplication means for multiplying a second coefficient with the phase error signal from said digital phase error calculation means to produce a second multiplication output,
an addition means for adding the first multiplication output of the first coefficient multiplication means and the second multiplication output of the second coefficient multiplication means to produce a result, and
a digital/analog conversion means for converting the result of the addition means to an analog signal and supplying the analog signal to the voltage-controlled type oscillating circuit.

* * * * *